US012604557B2

(12) United States Patent
Wang et al.

(10) Patent No.: US 12,604,557 B2
(45) Date of Patent: Apr. 14, 2026

(54) BACK-CONTACT SOLAR CELL, BACK-CONTACT SOLAR CELL ASSEMBLY, AND PHOTOVOLTAIC SYSTEM

(71) Applicants: ZHEJIANG AIKO SOLAR ENERGY TECHNOLOGY CO., LTD., Jinhua (CN); ZHUHAI FUSHAN AIKO SOLAR ENERGY TECHNOLOGY CO., LTD., Zhuhai (CN); TIANJIN AIKO SOLAR ENERGY TECHNOLOGY CO., LTD., Tianjin (CN); GUANGDONG AIKO SOLAR ENERGY TECHNOLOGY CO., LTD., Foshan (CN)

(72) Inventors: Yongqian Wang, Yiwu (CN); Shengpu Liu, Yiwu (CN); Gang Chen, Yiwu (CN)

(73) Assignees: ZHEJIANG AIKO SOLAR ENERGY TECHNOLOGY CO., LTD., Jinhua (CN); ZHUHAI FUSHAN AIKO SOLAR ENERGY TECHNOLOGY CO., L', Zhuhai (CN); TIANJIN AIKO SOLAR ENERGY TECHNOLOGY CO., LTD., Tianjin (CN); GUANGDONG AIKO SOLAR ENERGY TECHNOLOGY CO., LTD., Foshan (CN)

( * ) Notice: Subject to any disclaimer, the term of this patent is extended or adjusted under 35 U.S.C. 154(b) by 0 days.

(21) Appl. No.: 18/506,764

(22) Filed: Nov. 10, 2023

(65) Prior Publication Data

US 2024/0313136 A1     Sep. 19, 2024

(30) Foreign Application Priority Data

Mar. 16, 2023     (CN) ......................... 202310282218.X
Mar. 16, 2023     (CN) ......................... 202320570099.3

(Continued)

(51) Int. Cl.
*H10F 77/14*     (2025.01)
*H10F 77/20*     (2025.01)
*H10F 10/14*     (2025.01)

(52) U.S. Cl.
CPC ......... *H10F 77/147* (2025.01); *H10F 77/219* (2025.01); *H10F 10/146* (2025.01)

(58) Field of Classification Search
None
See application file for complete search history.

(56) References Cited

U.S. PATENT DOCUMENTS 5,053,083 A     10/1991 Sinton
7,406,616 B2     7/2008 Hendrickson et al.
(Continued)

FOREIGN PATENT DOCUMENTS

CN     107430981 A     12/2017
CN     112864275 A     5/2021
(Continued)

OTHER PUBLICATIONS

Machine translation of JP 6198813 (Year: 2017).*
(Continued)

*Primary Examiner* — Tamir Ayad
(74) *Attorney, Agent, or Firm* — ANOVA LAW GROUP, PLLC

(57)     ABSTRACT

A back-contact solar cell includes groove area and non-groove area that are alternately disposed on the shady face of silicon chip. At a predetermined position in the groove area, a first doped layer has an extending portion that extends above the groove area, and the second doped layer has a wrapping portion which covers and recombines with the first surface of the extending portion. No silicon wafer part is provided on the side of the position where the wrapping portion recombines with the first surface, and the (Continued)

edge recombination generated by the boundary area between them has a relatively narrow impact range, which can effectively improve the efficiency with a higher filling factor.

17 Claims, 11 Drawing Sheets

(30)        Foreign Application Priority Data

| May 23, 2023 | (CN) | ......................... 202310583236.1 |
| Jun. 23, 2023 | (CN) | ......................... 202321268949.0 |

(56)            References Cited

U.S. PATENT DOCUMENTS

| 8,488,715 | B2 | 7/2013 | Saitoh |
| 8,574,951 | B1 | 11/2013 | Wang |
| 9,712,145 | B2 | 7/2017 | Huang et al. |
| 2011/0063931 | A1 | 3/2011 | Linam et al. |
| 2016/0087122 | A1* | 3/2016 | Westerberg ......... H01L 31/0745 |
| | | | 136/258 |
| 2016/0284922 | A1 | 9/2016 | Qiu et al. |
| 2022/0376124 | A1 | 11/2022 | Feng et al. |
| 2022/0393044 | A1 | 12/2022 | Qiu et al. |
| 2023/0006076 | A1 | 1/2023 | Xu et al. |
| 2023/0027079 | A1 | 1/2023 | Chen et al. |

FOREIGN PATENT DOCUMENTS

| CN | 113284961 | A | | 8/2021 | |
| CN | 113299770 | A | | 8/2021 | |
| CN | 214898461 | U | | 11/2021 | |
| CN | 214898462 | U | | 11/2021 | |
| CN | 115000189 | A | | 9/2022 | |
| CN | 115498057 | A | | 12/2022 | |
| CN | 115513307 | A | | 12/2022 | |
| CN | 115513309 | A | | 12/2022 | |
| JP | 2001267610 | A | | 9/2001 | |
| JP | 2006523025 | A | | 10/2006 | |
| JP | 2012004565 | A | | 1/2012 | |
| JP | 2014022544 | A | | 2/2014 | |
| JP | 2015191962 | A | | 11/2015 | |
| JP | 6198813 | B2 | | 9/2017 | |
| JP | 7389934 | B1 | | 11/2023 | |
| KR | 20100073811 | A | * | 7/2010 | ............ H10F 77/211 |

OTHER PUBLICATIONS

Machine translation of JP 2015191962A (Year: 2015).*
Machine translation of KR 20100073811A (Year: 2010).*
Tao Zhou et al. "Study on the output characteristics of high-efficiency back contact solar cells with grooves on the back surface." Journal of bohai university (Natural Science Edition) 40.4 (2019): 371-377.

* cited by examiner

1000

200

BACK-CONTACT SOLAR CELL, BACK-CONTACT SOLAR CELL ASSEMBLY, AND PHOTOVOLTAIC SYSTEM

CROSS-REFERENCE TO RELATED APPLICATION

The present application claims the priority to Chinese Patent Application Nos. 202310282218.X and 2023205700993, both filed on Mar. 16, 2023, and Chinese Patent Application Nos. 2023105832361 and 2023212689490, both filed on May 23, 2023, the entire contents of all of which are incorporated herein by reference.

FIELD OF THE TECHNOLOGY

The present application relates to the field of solar cell technology, in particular to a back-contact solar cell, a back-contact solar cell assembly and a photovoltaic system.

BACKGROUND OF THE DISCLOSURE

Presently, among solar cells, back-contact solar cell is a type of cell with both the emitter and base contact electrodes disposed on its back (non light-receiving face). The cell's light-receiving face which is not obstructed by any metal electrodes effectively increases its short-circuit current.

In traditional technical solutions, the back of the back-contact solar cell is usually a flat surface where P and N regions are alternately disposed, and at least a portion of the P and N regions intersect. In such cases, the severe edge recombination generated at the boundary of P/N region on the back of the back-contact solar cell has a wide impact range that affects the electrical performance of the cell, especially the filling factor, causing a decreased efficiency of the back-contact solar cell.

SUMMARY

The present application provides a back-contact solar cell, a back-contact solar cell assembly, and a photovoltaic system, and aims to address the technical issue of reducing the impact range of recombination at the boundary area of P/N region on the shady face of the back-contact solar cell, improving the filling factor of the cell and further the conversion efficiency.

The present application is implemented as follows. The back-contact solar cell in some embodiments of the present application includes:

a silicon wafer, wherein the silicon wafer has a light-receiving face and a shady face which are mutually opposed, and the shady face is provided with a plurality of groove areas and a plurality of non-groove areas spaced at intervals, and the non-groove areas and groove areas are disposed alternately;

a first doped layer that is stacked on the non-groove area, and at a predetermined position in the groove area, the first doped layer has an extending portion extending above the groove area, and the extending portion has a first surface facing towards the groove area and a second surface facing away from the groove area;

a second doped layer that is stacked within the groove area and has a polarity opposite to the first doped layer, and at a predetermined position, the second doped layer has a wrapping portion that extends along the side wall surface of the groove area and covers the first surface, and the wrapping portion recombines with the first surface.

Further, the present application also provides a back-contact solar cell, including:

a silicon wafer, wherein the shady face of the silicon wafer includes a plurality of alternately disposed first region and second region, and slots are formed at the second region;

a first doped layer located on the first region, and at a predetermined position at the slot, the first doped layer includes a first part located above the first region and a second part extending above the slot; and a second doped layer disposed at the slot, and at the predetermined position, the second doped layer covers the bottom and side faces of the slot and wraps around the surface facing the slot and the side faces of the second part, and the second doped layer recombines with the surface of the second part facing the slot.

The present application also provides a back-contact solar cell assembly, including a back-contact solar cell as described in any of the above items.

The present application also provides a photovoltaic system, including the back-contact solar cell assembly mentioned above.

In the back-contact solar cell and its assembly and photovoltaic system of the present application, on the one hand, due to the presence of the groove area, the extending portion and the wrapping portion, the wrapping portion recombines with the first surface of the extending portion, and one side of the recombination area between the wrapping portion and extending portion is a groove area without any part of silicon wafer, and the edge recombination generated by the boundary region between the them only affects the silicon wafer on one side of the groove area, with a narrow range of impact, so that this can effectively reduce the number of affected carriers in the silicon wafer by narrowing the range of silicon wafer radiated by the boundary region, and improve the electrical performance and efficiency of the back-contact solar cell by increasing the filling factor. At a predetermined position, on the other hand, the recombination between the wrapping portion and the first surface of the extending portion can provide a certain recombination area to increase the current during electrical injection, and improve the repair efficiency and effectiveness during the subsequent repair of back-contact solar cells. The side of the extending portion which is not covered by the wrapping portion, meanwhile, can prevent the impact on the cell efficiency of the too large recombination area between the extending portion and the wrapping portion.

A part of the additional aspects and advantages of the present application will be provided in the following, and some will become apparent or may be learned through the practice of the application.

DETAILED DESCRIPTION

Figure 1:
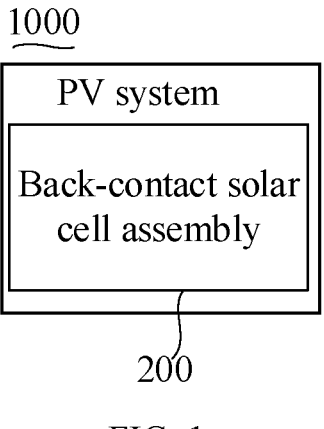
FIG. 1 is a schematic diagram of the module of the photovoltaic system provided in some embodiments of the present application.

In order to make the object, technical schemes and advantages of the present application clearer, the present application will be further described in detail with reference to the accompanying drawings and embodiments. The examples of some embodiments are shown in the accompanying drawings, where the same or similar labels throughout represent the same or similar elements or the elements with the same or similar functions. The embodiments described below with reference to the accompanying drawings are exemplary, and are only intended to explain the present application and cannot be understood as limiting the present application. In addition, it should be understood that the specific embodiments described here are intended for illustrating rather than limiting the present application.

In the description of the present application, it should be understood that, the terms "length", "width", "up", "down", "top", "bottom", "horizontal", and "vertical" indicate the orientation or position relationship based on the orientation or position relationship shown in the attached drawings, only for the convenience of simple description of the present application, rather than indicating or implying that the devices or elements referred to must have a specific orientation, be constructed and operated in a specific orientation, and therefore cannot be understood as a limitation on the present application.

In addition, the terms like "first" and "second" are only for illustrative purposes and cannot be understood as indicating or implying relative importance or the number of technical features referred to. Therefore, the features defined with "first" and "second" may explicitly or implicitly include at least one or a plurality of features. In the description of the present application, the meanings of "a plurality of" refer to two or more, unless otherwise specified.

In the description of the present application, it should be noted that unless otherwise specified and limited, the terms "installation", "connected", and "connection" should be broadly understood, for example, they may be fixed connection, detachable connection, or integrated connection, and may be mechanical connection, also be electrical connection, or mutual communication, direct connection or indirect connection through an intermediate medium, and may also be the internal connection or interaction relationship between two components. The person of ordinary skill in the art can, based on specific circumstances, understand the specific meanings of the above terms in the present application.

In the present application, unless otherwise specified and limited, the first feature "above" or "below" the second feature may include direct contact between the first and second features, or direct contact between the first and second features through additional features between them. Moreover, the first feature "over", "above" and "on" the second feature includes the first feature being directly above and diagonally above the second feature, or simply indicating that the first feature is horizontally higher than the second feature. The first feature "below", "beneath", and "under" the second feature includes the first feature directly below and diagonally below the second feature, or simply indicating that the horizontal height of the first feature is less than that of the second feature.

The following disclosure provides many different embodiments, or examples, to implement different features in the present application. The components and arrangements of specific examples are described below to simplify the disclosure of the present application. These are, of course, merely examples and are not intended to limit the present application. In addition, the present application may repeat reference numerals and/or letters in the various examples. This repetition is for the purpose of simplicity and clarity and does not in itself dictate a relationship between the various embodiments and/or configurations discussed. In further, the application provides examples of various specific processes and materials, but person of ordinary skill in the art can be aware of the application of other processes and/or the usage scenarios of other materials.

Embodiment 1

Figure 2:
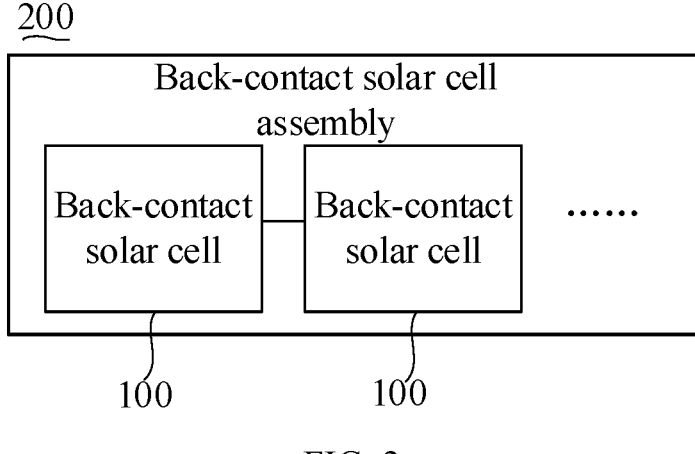
FIG. 2 is a schematic diagram of the module of the back-contact solar cell assembly provided in some embodiments of the present application.

Referring to FIGS. 1 and 2, the photovoltaic system 1000 in some embodiments of the present application may include the back-contact solar cell assembly 200 (the back-contact solar cell assembly), which in further include a plurality of back-contact solar cells 100 (the back-contact solar cell assembly) in some embodiments of the present application.

A plurality of back-contact solar cells 100 in the back-contact solar cell assembly 200 can be sequentially connected in series to form a plurality of cell strings. Each cell string can be connected in series, parallel, or in combination to achieve current output. The cells, for example, can be connected by welding strips to form a cell string, and the cell strings can be connected through a busbar. In some embodiments, cell strings can form cell arrays which are then packaged together through a front plate, front adhesive film, rear adhesive film, and back plate to form a back-contact solar cell assembly 200.

Figure 3:
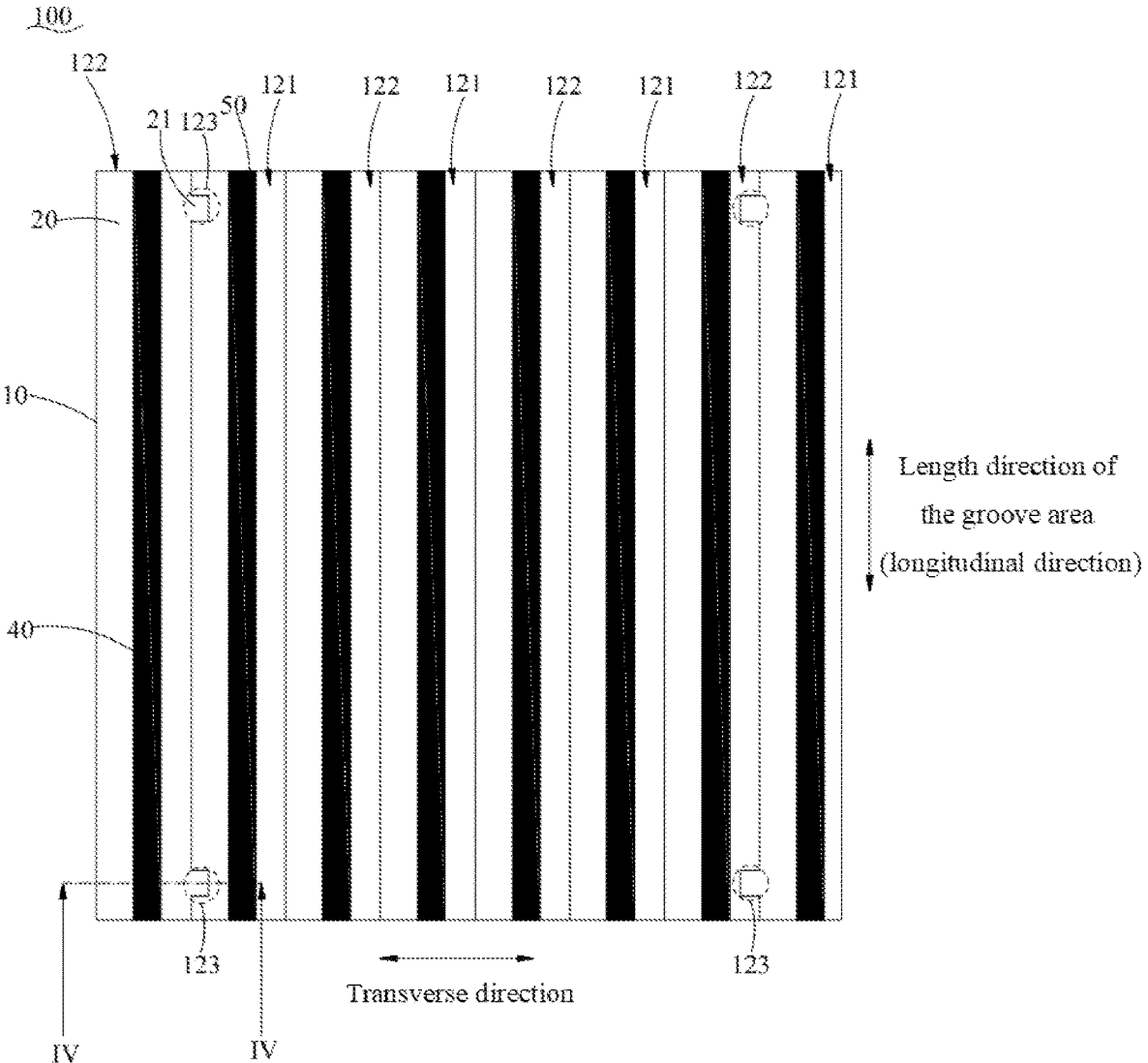
FIG. 3 is a schematic diagram of the planar structure of the back-contact solar cell provided in embodiment 1 of the present application.
Figures 4, 5:
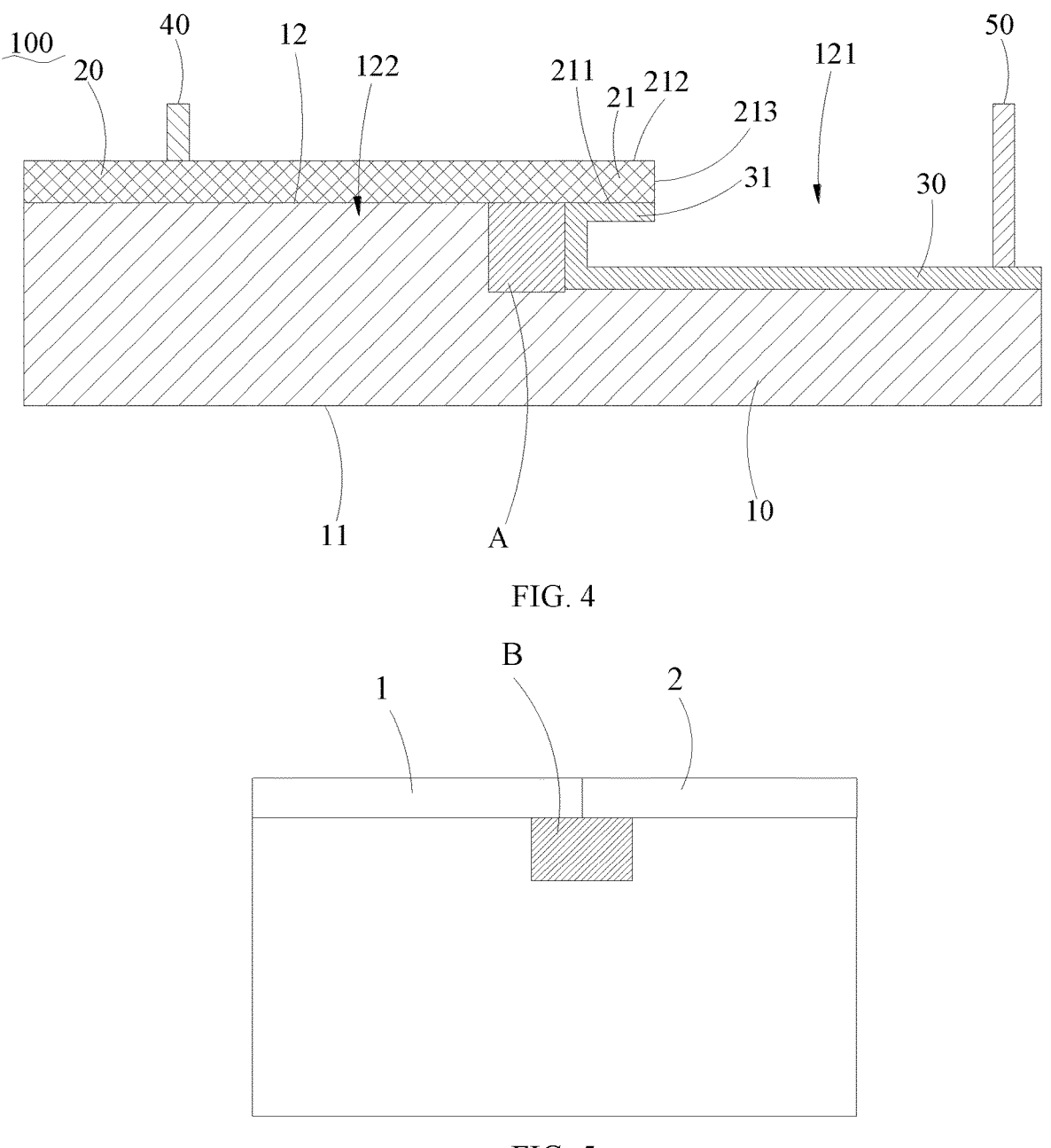
FIG. 4 is a cross-sectional schematic diagram of the IV-IV along the back-contact solar cell in FIG. 3.
FIG. 5 is a cross-sectional schematic diagram of a back-contact solar cell.

Referring to FIGS. 3 and 4, the back-contact solar cell 100 in some embodiments of the present application may include a silicon wafer 10, a first doped layer 20, and a second doped layer 30.

The silicon wafer 10 has a light-receiving face 11 and a shady face 12 which are mutually opposed, and the shady face 12 is provided with a plurality of groove areas 121 and a plurality of non-groove areas 122 spaced at intervals, and the non-groove areas 122 and groove areas 121 are disposed alternately;

Specifically, as shown in FIG. 3, the groove area 121 and the non-groove area 122 can be disposed alternately along the lateral direction of silicon wafer 10. In the illustrated embodiment, the edge area of silicon wafer 10 is the non-groove area 122, and both groove area 121 and non-groove area 122 extend along the longitudinal direction of the silicon wafer 10. The groove area 121 and non-groove area 122 can be formed through a plurality of slots that are disposed at intervals on the silicon wafer 10, and the formed slots correspond to the groove area 121 while the area between two adjacent slots corresponds to the non-groove area 122.

As shown in FIGS. 3 and 4, the first doped layer 20 can be stacked on the non-groove area 122. At a predetermined position 123 of the groove area 121, the first doped layer 20 has an extending portion 21 extending above the groove area 121, and the extending portion 21 has a first surface 211 facing towards the groove area 121 and a second surface 212 facing away from the groove area 121.

The second doped layer 30 can be stacked within the groove area 121 and has the polarity opposite to the first doped layer 20. Specifically, the first doped layer 20 can be an N-type doped layer, the second doped layer 30 can be a P-type doped layer, or vice versa, which is subject to no restriction here, as long as both doped layers have the opposite polarity. At the predetermined position 123 of the groove area 121, the second doped layer 30 has a wrapping portion 31, which extends along the side wall surface of the groove area 121 and covers the first surface 211 of the extending portion 21. The wrapping portion 31 recombines with the first surface 211 of the extending portion 21.

In the back-contact solar cell 100, back-contact solar cell assembly 200, and photovoltaic system 1000 in some embodiments of the present application, a plurality of groove areas 121 and non-groove areas 122 are disposed alternately on the shady face of the silicon chip. At a predetermined position 123 in the groove area 121, the first doped layer 20 has an extending portion 21 that extends above the groove area 121, and the second doped layer 30 has a wrapping portion 31 which covers and recombines with the first surface 211 of the extending portion 21. In such case, on one hand, due to the presence of the groove area 121, the extending portion 21, and the wrapping portion 31, the wrapping portion 31 recombines with the first surface 211 of the extending portion 21, and one side of the recombination area of the two is a groove area 121 without any part of silicon wafer (that is, a slot lies at one side of the recombination position), and the edge recombination generated by the boundary region between the two only affects the silicon wafer 10 on one side of the groove area 121 (the shaded part A in FIG. 4), with a narrow range of impact, so that this can effectively reduce the number of affected carriers in the silicon wafer by narrowing the range of silicon wafer 10 radiated by the boundary region, and improve the electrical performance and efficiency of the back-contact solar cell 100 by increasing the filling factor. At a predetermined position 123, on the other hand, the recombination between the wrapping portion 31 and the first surface 21 of the extending portion can provide a certain recombination area to increase the current during electrical injection, and improve the repair efficiency and effectiveness during the subsequent repair of back-contact solar cells 100.

It can be understood that in such an embodiment, the side 213 of the extending portion 21 can be covered by the wrapping portion 31 or not, preferably with the side 213 of the extending portion 21 not covered by the wrapping portion 31 (as shown in FIG. 4). The side 213 of the extending portion 21 which is not covered by wrapping portion 31, meanwhile, can prevent the impact on the cell efficiency of the too large recombination area between the extending portion 21 and the wrapping portion 31.

FIG. 5 presents the design scheme of shady face of the back-contact solar cell in traditional technology. In the traditional technical scheme, the P-type doped layer 2 and N-type doped layer 1 on the shady face of the back-contact solar cell are laid flat on the shady face of the silicon wafer. Edge recombination occurs at the junction of the P-type doped layer 2 and N-type doped layer 1, affecting the number of carriers, with the scope of impact shown in shaded part B in FIG. 5. The edge recombination with a wide range of impact results in a lower cell efficiency.

In the present application, however, the second doped layer 30 disposed within the groove area 121 has an extending portion 21 extending above the groove area 121, the second doped layer 30 has a wrapping portion 31 that recombines with the first surface 211 of the extending portion 21 only at the predetermined position 123, and at the junction of the wrapping portion 31 and the extending portion 21. The groove area 121 has a silicon wafer 10 at only one side. Their edge recombination only affects the silicon wafer 10 on one side of the groove area 121, with a narrow range of impact, and can effectively improve the efficiency of the back-contact solar cell 100.

In some embodiments of the present application, it should be noted that "the predetermined position 123 of groove area 121" can be understood as the entire groove area 121 or some positions of the groove area 121, which is subject to no restriction here. When the predetermined position 123 refers to the entire groove area 121, only a single groove area 121 or only a partial groove area 121 of the entire shady face 12 has a predetermined position 123.

In some embodiments of the present application, the predetermined position 123 are preferably some positions of the groove area 121. In such a case, a single or a plurality of predetermined positions 123 can be set in each groove area 121, and a plurality of predetermined positions 123 can be disposed at intervals along the longitudinal direction, which are subject to no restriction here. As shown in FIG. 3, for example, two predetermined positions 123 are provided in a single groove area 121. Of course, a single or more than two predetermined positions 123 can also be provided in a single groove area 121, which are subject to no restriction here.

In addition, in some embodiments of the present application, a single or a plurality of groove areas 121 can be provided with predetermined positions 123, which are subject to no restriction here. As shown in FIG. 3, for example, the groove areas 121 with predetermined positions 123 are groove areas 121 that are on both edges of the back-contact solar cell 100 in the transverse direction. In other embodiments, of course, a single or a plurality of groove areas 121 may be provided with predetermined positions 123, and groove areas 121 can also be located in the middle or other positions of the back-contact solar cell 100, which are subject to no restriction here.

In addition, it should be noted that in the present application, "the wrapping portion 31 recombines with the extending portion 21 towards the first surface 211" means the absence of insulation between them, and they can recombine through direct contact, or through tunneling via other dielectric layers. The two, for example, can be recombined through the second dielectric layer 80 mentioned below.

In some embodiments, a plurality of predetermined positions 123 can be uniformly distributed on the shady face 12 of the silicon wafer 10. As shown in FIG. 3, for example, four predetermined positions 123 can be distributed at four corners of the back-contact solar cell 100. Deploying a plurality of points where the second doped layer 30 contacts the first doped layer 20 on the shady face 12 can increase the current during electrical injection, and further improve the subsequent repair effect of the back-contact solar cell 100.

In the present application, the silicon wafer 10 can be either a P-type silicon wafer or an N-type silicon wafer, preferably be an N-type silicon wafer, which are subject to no restriction here.

In a possible embodiment, in the manufacturing process, the silicon wafer 10 can be cleaned first, and a first doped layer 20 can then be prepared on the entire shady face 12 of the silicon wafer 10. A portion of the first doped layer 20 can be then removed by etching or other methods, and a plurality of slots can be formed on the shady face 12 of the silicon wafer 10, so that a non-groove area 122 and a groove area 121 are formed and the first doped layer 20, at a predetermined position 123, has an extending portion 21 extending above the groove area 121. In a possible embodiment, for example, a portion of groove area can be formed by laser or etching, and then the area of slots can be horizontally expanded by etching to make the extending portion 21 extend above the groove area.

Subsequently, a second doped layer 30 can be prepared at the groove area 121 and the second doped layer 30, at a predetermined position 123, has a wrapping portion 31 that extends along the sidewall surface of the groove area 121 and covers the first surface 211 of extending portion 21.

It should be noted that as shown in FIG. 4, the side 213 of the extending portion 21 can be understood as the surface connecting the first surface 211 and the second surface 212 in the extending portion 21, that is, the end face of one end of the extending portion 21.

In some embodiments of the present application, the back-contact solar cell 100 further includes a first electrode 40 and a second electrode 50. The first electrode 40 can be disposed in a non-groove area 122 to maintain ohmic contact with the first doped layer 20, while the second electrode 50 can be disposed in a groove area 121 to maintain ohmic contact with the second doped layer 30. The first electrode 40 can be an N-type electrode, the second electrode 50 can be a P-type electrode, or vice versa, and the second electrode 50 can be an N-type electrode. The polarities of the first electrode 40 and the second electrode 50 correspond to the polarities of the first doped layer 20 and the second doped layer 30, respectively, both of which are metal electrodes.

Figure 6:
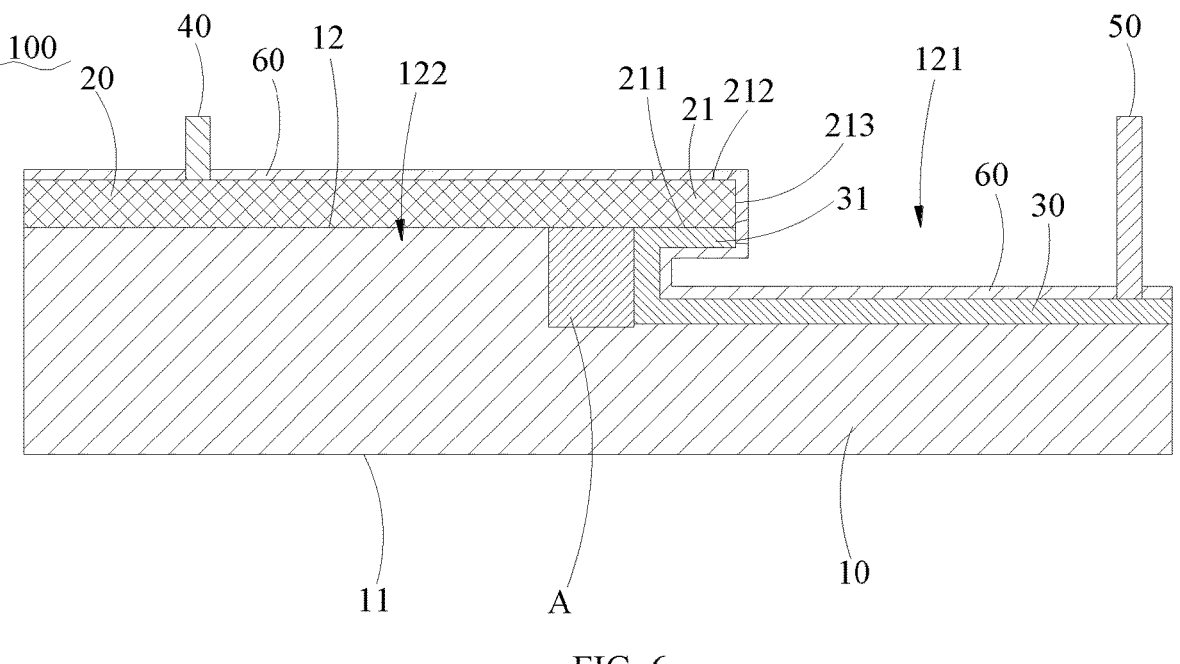
FIG. 6 is another cross-sectional schematic diagram of the IV-IV along the back-contact solar cell in FIG. 3.

In addition, referring to FIG. 6, in the back-contact solar cell 100 presented in the applied embodiment, a passivation film layer 60 covering the entire shady face 12 can also be provided on the shady face 12 of the silicon chip 10. The first electrode 40, which is located on the non-groove area 122, runs through the passivation film layer 60 to form ohmic contact with the first doped layer 20, and the second electrode 50, which can be located in the groove area 121, runs through the passivation film layer 60 to form ohmic contact with the second doped layer 30.

Further, it can be understood that in some embodiments of the present application, in the groove area 121, except for the predetermined position 123, physical isolation is provided between the first doped layer 20 and the second doped layer 30, that is to say, in the area other than the predetermined position 123, the first doped layer 20 has no extending portion 21 and the second doped layer 30 has no wrapping portion 31.

In this way, except for the area to which the predetermined position 123 corresponds, the physical isolation between the first doped layer 20 and the second doped layer 30 can avoid the impact on the efficiency of the back-contact solar cell 100 due to their excessive contact area.

Specifically, in such embodiments, except for the predetermined position 123, physical isolation is realized between the first doped layer 20 and the second doped layer 30 directly through the groove area 121, or by other means, such as insulation components, which are subject to no restriction here.

Figure 7:
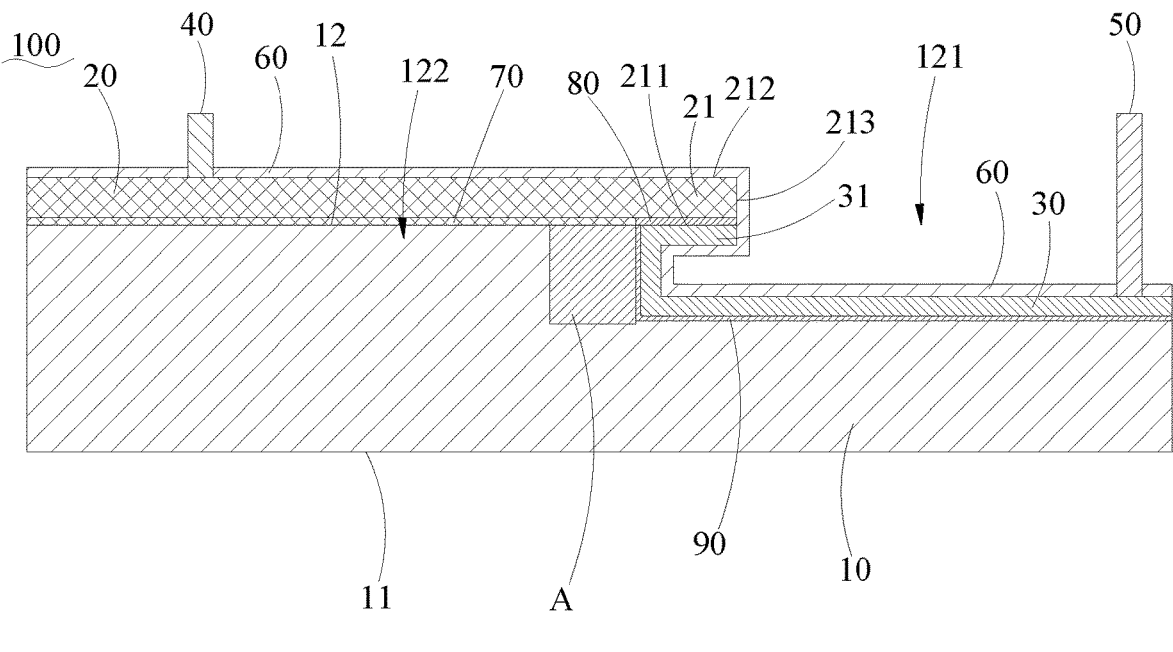
FIG. 7 is yet another cross-sectional schematic diagram of the IV-IV along the back-contact solar cell in FIG. 3.

Referring to FIG. 7, in further, in some embodiments, the back-contact solar cell 100 may include a first dielectric layer 70 stacked on a non-groove area 122. A first doped layer 20 is stacked on top of the first dielectric layer 70 having tunneling function, that is, a first dielectric layer 70, which can be a tunneling layer, is disposed between the area of the first doped layer 20 other than the extending portion 21 and the silicon wafer 10. The film layers with passivation and tunneling functions, such as silicon oxide tunneling layers, can be selected based on the actual conditions, which are subject to no restriction here.

The arrangement of the first dielectric layer 70 can effectively optimize the non-groove area 122 to ensure the efficiency while implementing the tunneling function.

Referring to FIG. 7, in some embodiments, the back-contact solar cell 100 can also include a second dielectric layer 80 stacked on the first surface 211. The wrapping portion 31 covers the second dielectric layer 80 through which wrapping portion 31 recombines with the first surface 211.

The arrangement of a second dielectric layer 80 between the wrapping portion 31 and the first surface 211 can, while achieving the passivation function of the first surface 211, allow for recombination between the wrapping portion 31 and the first surface 211 to increase the current during electrical injection, and to improve the repair efficiency and effect. The deployment of the second dielectric layer 80, in other words, can ensure the passivation effect of the extending portion 21 while improving the repair efficiency and effect.

Specifically, the second dielectric layer 80 can be an oxide layer, such as a silicon oxide film or other film layer, and its specific types can be selected based on the actual conditions, which are subject to no restriction here.

In further, in some embodiments, the second dielectric layer 80 can be 0.5 nm-50 nm thick.

The second dielectric layer 80 having a thickness within the reasonable range of 0.5 nm-50 nm can, while ensuring the passivation effect of the first surface 211, improve the electrical injection of the cell, and avoid the poor passivation caused by the thin second dielectric layer 80, and the low tunneling efficiency caused by the thick second dielectric layer 80.

Specifically, in such embodiments, the thickness of the second dielectric layer 80 may be, for example, 0.5 nm, 1 nm, 1.5 nm, 2 nm, 2.5 nm, 3 nm, 3.5 nm, 4 nm, 4.5 nm, 5 nm, 5.5 nm, 6 nm, 7 nm, 8 nm, 9 nm, 10 nm, 15 nm, 20 nm, 25 nm, 30 nm, 35 nm, nm, 45 nm, 50 nm, or any value between 0.5 nm-50 nm, which are subject to no restriction here.

Figure 8:
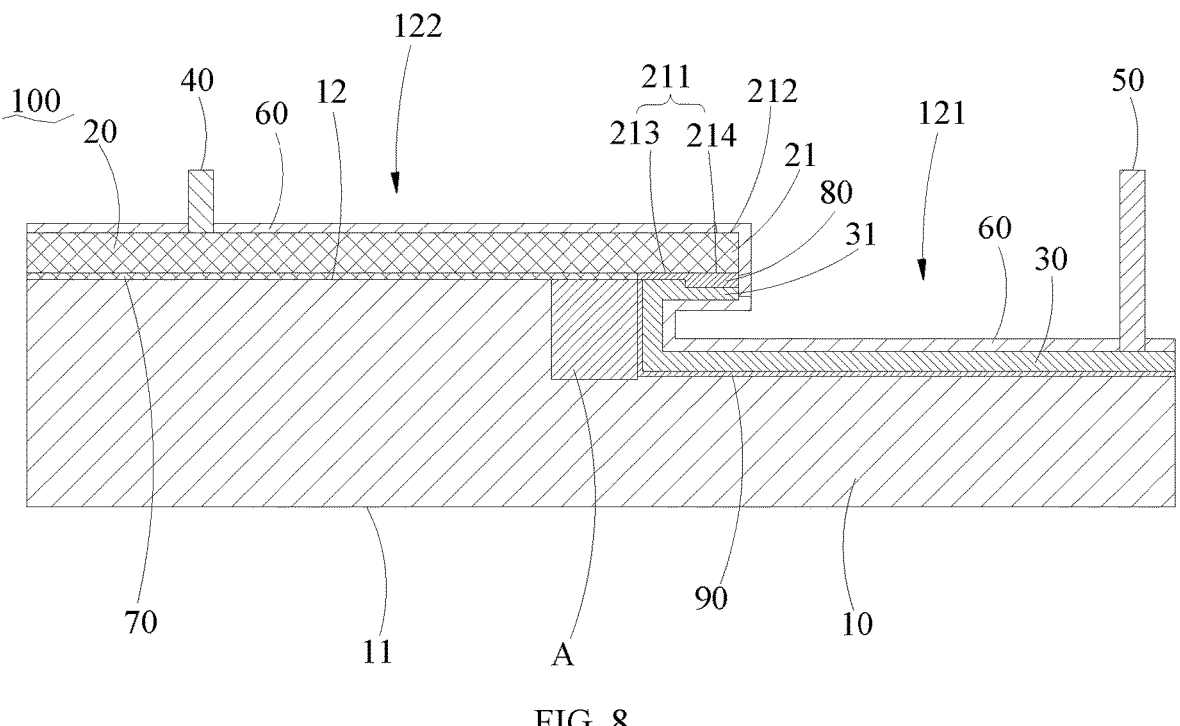
FIG. 8 is still another cross-sectional schematic diagram of the IV-IV along the back-contact solar cell in FIG. 3.

Referring to FIG. 8. In some embodiments, the first surface 211 has adjacent and continuous first regions 213 and second regions 214 along the arrangement direction of the groove area 121 and non-groove area 122. The second dielectric layer 80 is stacked on the first surface 211 of the extending portion 21, and the thickness of the second dielectric layer 80 at the second region 214 is greater than the thickness of the second dielectric layer 80 at the first region 213. The part of the second dielectric layer 80 located in the first region 213 has tunneling function.

Specifically, the second dielectric layer 80 can be an oxide layer, for example, the film layer with passivation function such as a silicon oxide film layer, which has tunneling function at the first region 213. The specific types can be selected based on the actual conditions, which are subject to no restriction here.

Since the part of the second dielectric layer 80, which is located in the first region 213, has the tunneling function and the thickness of second dielectric layer 80 at the second region 214 is greater than that of the second dielectric layer 80 at the first region 213, the wrapping portion 51 can recombine with the extending portion 21 at the first region 213 to increase the current during electrical injection, thereby improving the subsequent repair efficiency and effectiveness. A thinner second dielectric layer 80 in the first region 213, meanwhile, can achieve better electrical injection effect, while a thicker one in the second region 214 can improve the passivation effect. A second dielectric layer 80 having a larger thickness at the second region 214 than the one at the first region 213, in other words, can achieve better electrical injection effect and improve the repair efficiency and effect, while ensuring the passivation effect.

In a possible embodiment, in the manufacturing process, the silicon wafer 10 can be cleaned and fluffed, and a first dielectric layer 70 can be deposited on the entire shady face 12 of the silicon wafer 10, and then a first doped layer 20 can be formed on the first dielectric layer 70. A portion of the first doped layer 20 and the first dielectric layer 70 can be removed through etching and other means, and a plurality of slots are formed on the shady face 12 of the silicon wafer 10, so that a plurality of groove areas 121 and non-groove areas 122 are alternately disposed and at the predetermined position 123, the extending portion 21 of the first doped layer extends above the groove area 121. In a possible embodiment, for example, some slots are formed by laser or etching, and then the area of slots can be horizontally expanded by etching, so that the first doped layer 20 has an extending portion 21 extending above the groove area 121.

Subsequently, a second dielectric layer 80 can be deposited on the first surface 211 of the extending portion 21. In some possible embodiments, the thickness of the second dielectric layer 80 at the first region 213 of the first surface 20) 211 can be reduced by twice deposition to be smaller than that of the second dielectric layer 80 at the second area 214 of the first surface 211.

Then, a second polar doped layer 50 can be deposited at the groove area 121 by deposition and, at the predetermined position 123 the second polar doped layer 50 has a wrapping portion 51 that is stacked to cover the second dielectric layer 80.

Figure 9:
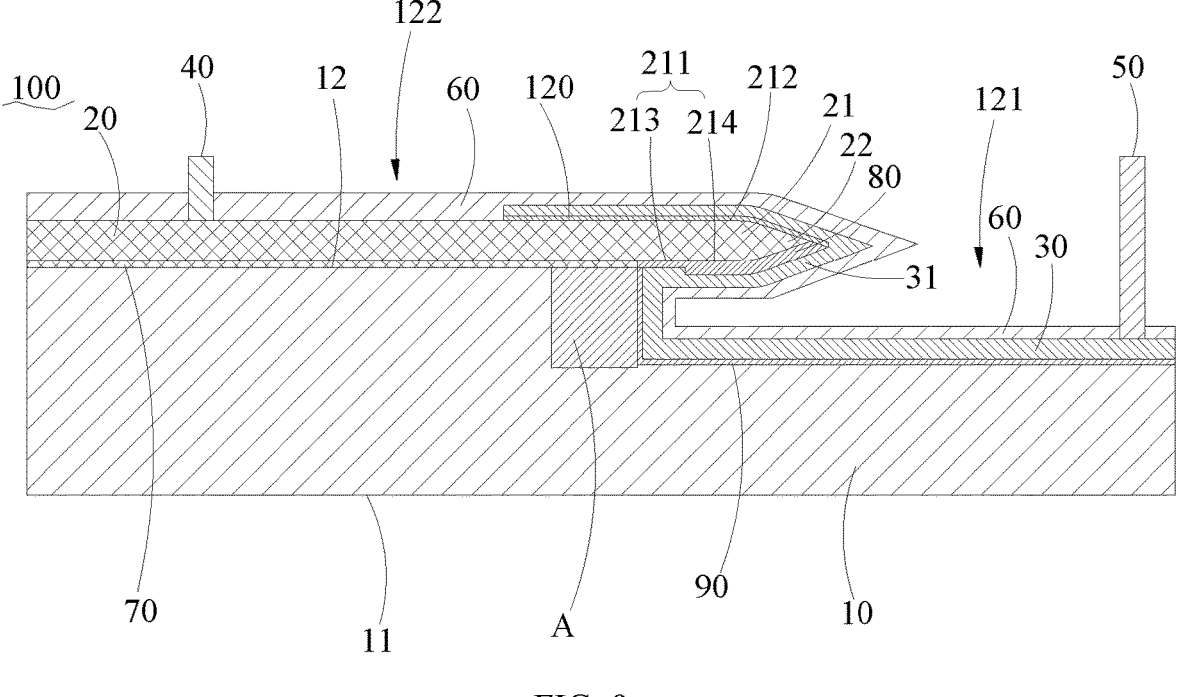
FIG. 9 is still another cross-sectional schematic diagram of the IV-IV along the back-contact solar cell in FIG. 3.

Referring to FIG. 9, in some embodiments, at the predetermined position 123 of the groove area 121, the wrapping portion 51 can also wrap around the first surface 211, end, and second surface 312 of the entire extending portion 21, that is, the wrapping portion 51 can, along the side of groove area 121, extend to cover the second dielectric layer 80 and wrap around the end of extending portion 21 and cover the second surface 312 of the extending portion 21, even the first doped layer on the non-groove area 122. In this case, the insulation layer 120 (as shown in FIG. 9) can be provided between the wrapping portion 51 and the second surface 312, which can be a dielectric layer with insulation function, such as a silicon oxide layer, a silicon nitride layer, etc.

As shown in FIGS. 4 to 8, in some embodiments, of course, the wrapping portion 51 may only cover the first surface 211 of the extending portion 21. In addition, in other embodiments, the wrapping portion 51 can only cover the first surface 211 and end of the extending portion 21 (i.e., the end face of the extended end of extending portion 21 in FIG. 4-8), which are subject to no restriction here.

In some embodiments, the second dielectric layer 80 can be 0.5 nm-6 nm thick in the first region 213, and 2 nm-50 nm thick in the second region 214.

The second dielectric layer 80 having a thickness in the first region 213 within the reasonable range of 0.5 nm-6 nm can, while ensuring the passivation effect of the first surface 211, improve the electrical injection of the cell, and avoid the poor passivation caused by the thin first region 213, and the low tunneling efficiency caused by the thick first region 213. The second dielectric layer 80 having a thickness in the second region 214 within the reasonable range of 2 nm-50 nm can avoid the poor passivation caused by the thin second region 214 and the low tunneling efficiency caused by the thick second region 214.

Specifically, in such embodiments, the thickness of the second dielectric layer 80 in the first region may be, for example, 0.5 nm, 1 nm, 1.5 nm, 2 nm, 2.5 nm, 3 nm, 3.5 nm, 4 nm, 4.5 nm, 5 nm, 5.5 nm, 6 nm, or any value between 0.5 nm-6 nm, which are subject to no restriction here. The thickness of the second dielectric layer 80 in the second region 214 may be, for example, 2 nm, 3 nm, 4 nm, 5 nm, 6 nm, 7 nm, 8 nm, 9 nm, 10 nm, 15 nm, 20 nm, 25 nm, 30 nm, 35 nm, 40 nm, 45 nm, 50 nm, or any value between 2 nm-50 nm, which are subject to no restriction here.

In further, in such embodiments, the second dielectric layer 80 is preferably 4 nm-5 nm thick in the first region 213, and 15 nm-45 nm thick in the second region 214.

Specifically, the inventor of the present application has discovered through verification and research that the first region 213 with a thickness less than 4 nm or larger than 5 sm is more likely to lead to a reduced passivation effect or a decreased tunneling efficiency. Meanwhile, the second region 214 with a thickness less than nm or greater than 45 nm will lead to a reduced passivation effect or a significantly increased cost. The research and verification demonstrates that the second dielectric layer 80 having a thickness within the preferred range of 4 nm-5 nm in the first region 213 can increase the tunneling efficiency with improved subsequent repair efficiency, while ensuring the passivation effect of the first region 213. Meanwhile, the second dielectric layer 80 having a thickness within the preferred range of 15 nm-45 nm in the second region 214 can effectively control the costs while ensuring the passivation effect of the second region 214.

It can be understood that in such embodiments, the thickness of the second dielectric layer 80 at the first region 213 can preferably be 4 nm, 4.1 nm, 4.2 nm, 4.3 nm, 4.4 nm, 4.5 nm, 4.6 nm, 4.7 nm, 4.8 nm, 4.9 nm, 5 nm, or any value between 4 nm-5 nm, which are subject to no restriction here. The thickness of the second dielectric layer 80 at the second region 214 may preferably be 15 nm, 20 nm, 25 nm, nm, 35 nm, 40 nm, 45 nm, or any value between 15 nm-45 nm, which are subject to no restriction here.

In some embodiments, along the arrangement direction of the groove area 121 and the non-groove area 122 (i.e., the transverse direction in FIG. 3), the length of the first region 213 can be 0.05 um-1 um and the length of the second area 214 can be 0.1 um-10 um long.

The first region 213 and second region 214 having a length within the reasonable range mentioned above can effectively ensure that the recombination area of the wrapping portion 51 and the extending portion 21 falls within a reasonable range, thereby increasing the current during electrical injection, ensuring the repair efficiency and effectiveness, and in further, such arrangement can avoid the failure to reach the desired repair effect because of the too short first region 213 and second region 214 which lead to a too small recombination area, and also prevent the impact of too large recombination area between the first region 213 and second region 214 on the efficiency of the back-contact solar cell 100 due to their too large length.

Specifically, in such embodiments, the length of the first region 213 can be 0.05 um, 0.1 um, 0.1 um, 0.2 um, 0.25 um, 0.3 um, 0.35 um, 0.4 um, 0.45 um, 0.5 um, 0.55 um, 0.6 um, 0.65 um, 0.7 um, 0.75 um, 0.8 um, 0.85 um, 0.9 um, 0.95 um, 1 um, or any value between 0.05 um-1 um, which are subject to no restriction here. The length of the second region 214 can be, for example, 0.1 um, 0.5 um, 0.6 um, 0.7 um, 0.8 um, 0.9 um, 1 um, 2 um, 3 um, 4 um, 5 um, 6 um, 7 um, 8 um, 9 um, 10 um, or any of the value between 0.1 um-10 um.

In further, in such an embodiment, along the arrangement direction of the groove area 121 and the non-groove area 122, the length of the first region 213 can be preferably 0.5 um-1 um and the length of the second region 214 can be preferably 0.5 um-3 um.

The first region 213 and the second region 214 having the length within the above preferred range can, while ensuring the efficiency, maximize the current during electrical injection to improve the repair efficiency and effect, also balance the efficiency of cells and the electrical injection.

Specifically, the inventor of the present application has found through verification and research that the first region 213 with length less than 0.5 um will lead to a poor repair efficiency, and the first region 213 with length greater than 1 um will lead to a decrease in efficiency. The research and verification show that the first region 213 with length within the preferred range of 0.5 um-1 um can ensure subsequent repair efficiency and effectiveness while ensuring the stable efficiency. As for the length of the second region 214, the inventor of the present application has found through verification and research that the second region 214 with length less than 0.5 um is more likely to cause poor passivation effect of the extending portion 21, and the second region 214 with a too large length (greater than 3 um) will lead to a too long extending portion 21, resulting in a significant increase in process difficulty and costs. The second region 214 with length within the preferred range of 0.5 um-3 um therefore can effectively control the costs while ensuring the passivation effect.

Referring to FIG. 9, in some embodiments, the first surface 211 and the second surface 312 intersect at the end of the extending portion 21 to form a tip portion 32 around which the wrapping portion 51 wraps.

The end of the extending portion 21 is pointed, and the wrapping portion 51 which even if wraps around the tip portion 32 only maintains line surface contact with the tip of tip portion 32, thus reducing the contact area between the end of the extending portion 21 and the wrapping portion 51 and, as a result, lowering the recombination.

It can be understood that, of course, in some embodiments, the end of the extending portion 21 may not form a tip, that is, the first surface 211 and the second surface 312 may be connected through the end face (as shown in FIG. 4). In such a case, the wrapping portion 51 may or may not wrap around the end face of extension part 21 (as shown in FIG. 4), which are subject to no restriction here. When the wrapping portion 51 wraps around the end face of extending part 21, a dielectric layer can be or not be provided between the end face and the wrapping portion 51. The dielectric layer, if provided, can be a metal oxide layer, an intrinsic silicon layer, and other film layers, which are subject to no restriction here.

In further, in some embodiments, holes can be formed at the end of the tip portion 32.

The formation of holes on the end of the tip portion 32 can reduce the contact area between the wrapping portion 51 and the end of tip portion 32, thereby reducing the recombination.

In some embodiments, the extending portion 21 is 0.15 um-10 um long in the arrangement direction (i.e., transverse direction) of the groove area 121 and the non-groove area 122.

The extending portion 21 having the protrusion length within the reasonable range mentioned above can effectively ensure the recombination area between the wrapping portion 31 at the predetermined position 123 and the extending portion 21, increase the current during electrical injection and ensure repair efficiency and effectiveness. In further, the arrangement can avoid the failure to reach the desired repair effect because of the too short extending portion 21 which leads to a too small recombination area, and also prevent the impact of too large recombination area between them on the efficiency of the back-contact solar cell 100 due to the too long extending portion 21.

Specifically, the length of the extending portion 21 may be 0.15 um, 0.2 um, 0.4 um, 0.6 um, 0.8 um, 1 um, 2 um, 3 um, 4 um, 5 um, 6 um, 7 um, 8 um, 9 um, 10 um, or any value between 0.15 um-10 um, for example, which are subject to no restriction here.

In some embodiments, in the length direction of the groove area 121 (i.e., the longitudinal direction in FIG. 3), the ratio of the sum of the lengths of all extending portions 21 on the shady face 12 of the silicon wafer 10 to the area of shady face 12 is 0.003 $cm/cm^2$-0.6 $cm/cm^2$.

Reasonably controlling the ratio of the total length of all extending portions 21 in the length direction of the groove area 121 to the area of shady face 12 of the silicon wafer 10 can avoid the failure to achieve the required repair effect because of the too small total length of extending portions 21 in the length direction of the groove area 121, and also prevent the impact of the too large proportion of extending portions 21 on the efficiency of cells, that is, ensuring the efficiency of back-contact solar cell 100 as well as the repair effect.

Specifically, in this application, as shown in FIG. 3, the length direction of the groove area 121 is the extension direction of the groove area 121, that is, the longitudinal direction of the back-contact solar cell 100. The length of extending portion 21 in the length direction of groove area 121 is the width of the extending portion 21 along the longitudinal direction of back-contact solar cell 100, that is to say, the ratio of the sum of the longitudinal widths of all extending portions 21 on the entire cell to the area of shady face 12 of the silicon wafer 10 is 0.003 $cm/cm^2$-0.6 $cm/cm^2$. FIG. 3, for example, shows four extending portions 21, and the ratio of the sum of the longitudinal widths of the four extending portions 21 to the area of shady face 12 is 0.003 $cm/cm^2$-0.6 $cm/cm^2$.

In some embodiments of the present application, the ratio of the total length of all extending portions 21 on the shady face 12 of silicon wafer 10 to the area of the shady face 12 of silicon wafer 10 can be, for example, 0.003 $cm/cm^2$, 0.01 $cm/cm^2$, 0.02 $cm/cm^2$, 0.03 $cm/cm^2$, 0.04 $cm/cm^2$, 0.05 cm/cm², 0.06 cm/cm², 0.07 cm/cm², 0.08 cm/cm², 0.09 cm/cm², 0.1 cm/cm², 0.2 cm/cm², 0.3 cm/cm², 0.3 cm/cm², 0.4 cm/cm², 0.5 cm/cm², 0.6 cm/cm², or any value between 0.003 cm/cm²-0.6 cm/cm², which are subject to no specific restrictions here.

In some embodiments, in a single groove area 121, the number of predetermined positions 123 is M, and the number of extending portions 21 and wrapping portions 31 is also M (for example, as shown in FIG. 3, the number of predetermined positions 123 in a single groove area 121 is two). In the length direction of groove area 121, the ratio of the total length of M extending portions 21 to the length of a single groove area 121 is 0.005-0.5, and M is a positive integer greater than or equal to 1.

In the length direction of groove area 121, setting the ratio of the total length of extending portions 21 at all predetermined positions 123 to the length of groove area 121 within the reasonable range can prevent the failure to achieve the required repair effect due to the too small proportion of extending portions 21 in a single groove area 121, and also avoid the impact on the cell efficiency of the too large proportion of extending portions 21 in a single groove area 121, that is, ensuing the efficiency of back-contact solar cell 100 as well as the repair effect.

Specifically, as shown in FIG. 3, in such an embodiment, "the sum of the lengths of M extending portions 21 in the length direction of groove area 121" can be understood as the sum of the widths of all extending portions 21 in the longitudinal direction of the back-contact solar cell 100. The length of groove area 121 is the extension length of groove area 121 in the longitudinal direction of the back-contact solar cell 100. In some embodiments, for example, the length of a single extending portion 21 in the longitudinal direction can be 0.1 cm, the total length of groove area 121 is 10 cm, and M is 5. The total length of all extending portions 21 is 0.5 cm, accounting for 0.05 of the total length of groove area 121.

In such an embodiment, the ratio of the total length of M extending portions 21 to the length of groove area 121 can be 0.005, 0.006, 0.007, 0.008, 0.009, 0.01, 0.02, 0.03, 0.04, 0.05, 0.06, 0.07, 0.08, 0.09, 0.1, 0.2, 0.3, 0.4, 0.5, or any value between 0.005-0.5, which are subject to no restriction here.

In some embodiments, on the shady face 12 of the silicon wafer 10, the ratio of the sum of orthographic projection areas (i.e., the orthographic projection areas along the thickness direction) of all extending portions 21 on the shady face 12 of silicon wafer 10 to the area of shady face 12 on the silicon wafer 10 is $4.5*10^{-8}$-$1.5*10^{-5}$.

Setting the proportion of orthographic projection areas of all extending portions 21 within this reasonable range can avoid poor repair effect because of too small area proportion of extending portions 21, and can also prevent the serious impact on the efficiency of back-contact solar cell 100 of the too large area proportion of extending portions 21, that is, ensuring the efficiency of back-contact solar cell 100 as well as the repair effect.

Specifically, in such an embodiment, the proportion of orthographic projection area of all extending portions 21 on the shady face 12 of silicon wafer 10 to the shady face 12 on the silicon wafer 10 can be $4.5*10^{-8}$, $5*10^{-8}$, $6*10^{-8}$, $7*10^{-8}$, $8*10^{-8}$, $9*10^{-8}$, $1*10^{-7}$, $1*10^{-6}$, $1*10^{-5}$, $1.5*10^{-5}$, or any other value between $4.5*10^{-8}$-$1.5*10^{-5}$, which are subject to no restriction here.

Referring to FIG. 7 to 9, in some embodiments, a third dielectric layer 90, which may be an oxide tunneling layer, can be provided between the second doped layer 30 and the bottom and side faces of groove area 121. In some embodiments, for example, the third dielectric layer 90 can be a silicon oxide tunneling layer, and the presence of the third dielectric layer 90 can provide ideal passivation in the groove area 121. The thickness of the third dielectric layer 90 can be determined according to the actual conditions, which are subject to no restriction here.

Figure 10:
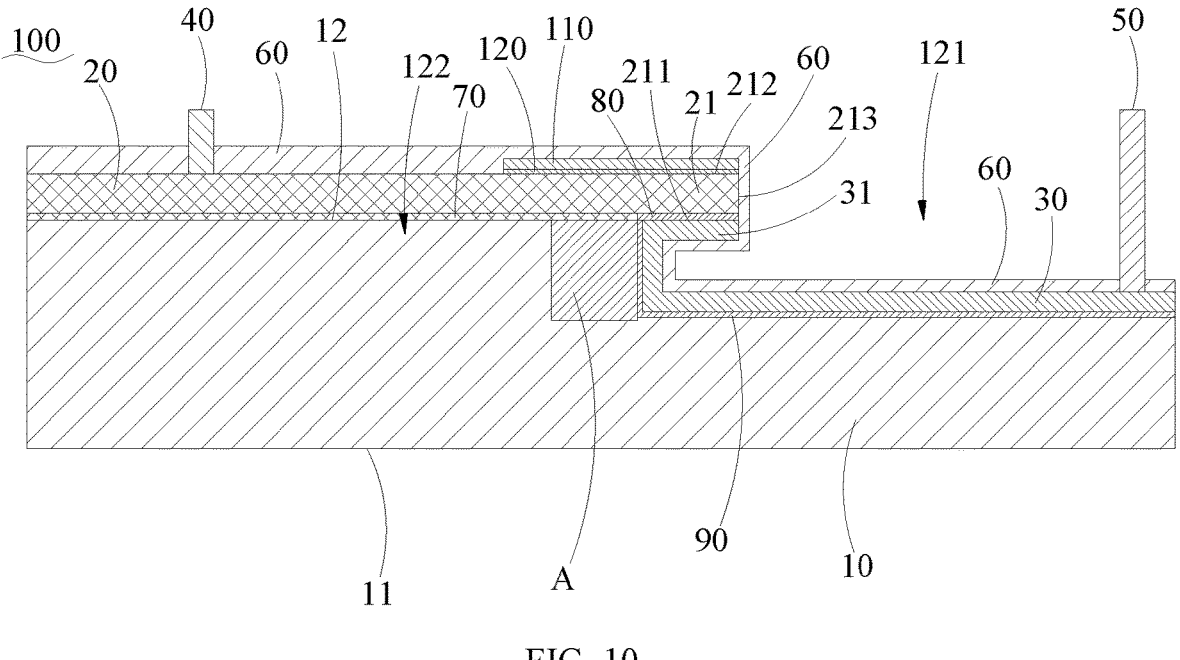
FIG. 10 is still another cross-sectional schematic diagram of the IV-IV along the back-contact solar cell in FIG. 3.

Referring to FIG. 10, in some embodiments, at the predetermined position 123, a third doped layer 110 is stacked on the second surface of the extending portion 21. The third doped layer 110 has the same polarity as the second doped layer 30 and covers the second surface 212, and an insulation layer 120 is provided between the third doped layer 110 and the second surface 212 of the extending portion 21 facing away from the groove area 121.

Specifically, in the process of manufacturing the back-contact solar cell 100, when the second doped layer 30 is deposited to form the wrapping portion 31, the wrapping portion 31 may extend to cover the first surface 211, the side 213 of the extending portion 21, and the second surface 212 opposite the first surface 211. In order to avoid the recombination of wrapping portion 31 at the side 213 of extending portion 21, the wrapping portion 31 on the side 213 has to be removed later. In this case, an insulation layer 120 is disposed on the surface of extending portion 21 and 20) the first surface 211 to isolate the doped layer on the second surface 212 opposite the first surface 211 from the extending portion 21 to avoid excessive recombination. Meanwhile, with the help of the insulation layer 120, the process difficulty and cost can be reduced by removing the doped layer on the side 213 through a single process, without removing the doped layer on the second surface 212 opposite the first surface 211. The doped layer retained on the second surface 212 opposite the first surface 211 is the third doped layer 110.

In some embodiments, the insulation layer 120 can be a dielectric layer with insulation function, such as a silicon oxide layer, a silicon nitride layer, etc. In addition, as shown in FIG. 10, in such an embodiment, the third doped layer 110 can also cover a portion of the first doped layer 20. In this case, the third doped layer 110 and the first doped layer 20 are also isolated through the insulation layer 120. The first electrode 40 can be disposed in an area of the first doped layer which is not covered by the third doped layer 110 to maintain ohmic contact with the first doped layer 20 and insulation isolation with the third doped layer 110, while the second electrode 50 can be disposed in the corresponding area of the groove area 121 to maintain ohmic contact with the second doped layer 30.

In some embodiments, the depth of the groove area 121 (i.e., depth of the depression, namely depth of the slot forming the groove area 121) can be 0.1 um-15 um.

The groove area 121 having a depth within this reasonable range can, when the wrapping portion 31 recombines with the extending portion 21, avoid the affected area extending to the silicon wafer 10 at the bottom of groove area 121 due to the shallow groove area 121, and also avoid a significant decrease in the strength of silicon wafer 10 due to the excessive depth of groove area 121. The groove area 121 having a depth within this reasonable range, in other words, can minimize the impact range while ensuring the strength of silicon wafer 10, when the wrapping portion 31 recombines with the extending portion 21.

Specifically, the inventor of the present application found that, when the depth of groove area 121 is less than 0.1 um, the impact range of the recombination between wrapping portion 31 and extending portion 21 is not only limited to one side of the groove area 121, but will also extend to the bottom of groove area 121, resulting in a larger impact range. The groove area 121 with a depth greater than 0.1 um can avoid such problems and minimize the range of impact on silicon wafer as much as possible, and the groove area 121 with a depth greater than 15 um will cause a serious decrease in the overall strength and increase the risk of cracking of silicon wafer 10.

In such an embodiment, the depth of groove area 121 can be, for example, 0.1 um, 0.2 um, 0.3 um, 0.4 um, 0.5 um, 0.6 um, 0.7 um, 0.8 um, 0.9 um, 1 um, 2 um, 3 um, 4 um, 5 um, 6 um, 7 um, 8 um, 9 um, 10 um, 11 um, 12 um, 13 um, 14 um, 15 um, or any value between 0.1 um-15 um, which are subject to no restriction here.

Embodiment 2

It should be noted that, as shown in FIG. 11-15 in which the structural schematic diagram in embodiment 2 is presented, the same or similar labels always represent the same or similar components, or the components with the same or similar functions. Embodiment 2 has different labeling rules from embodiment 1.

Figure 11:
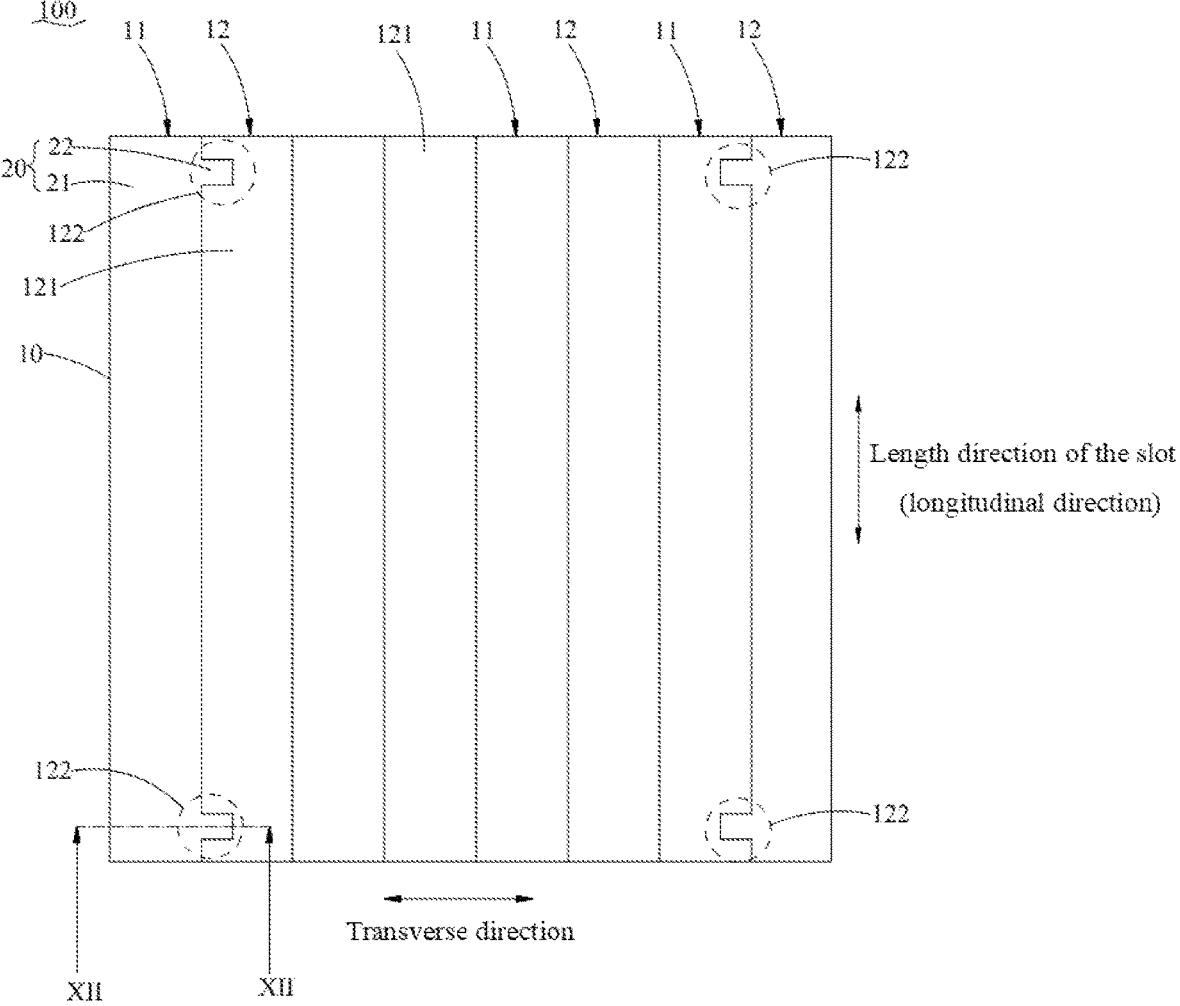
FIG. 11 is still another schematic diagram of the planar structure of the back-contact solar cell provided in embodiment 2 of the present application.
Figure 12:
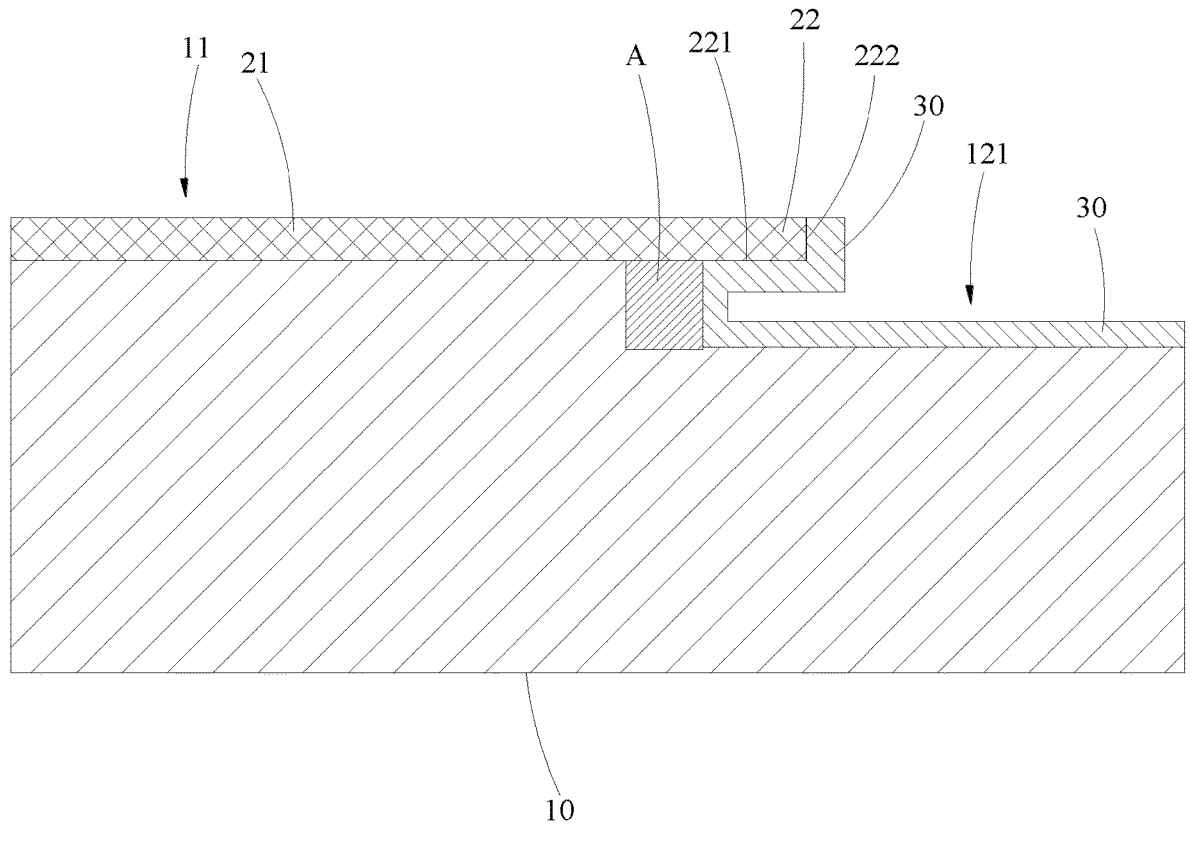
FIG. 12 is still another cross-sectional schematic diagram of XII-XII along the back-contact solar cell in FIG. 11.

Referring to FIGS. 11 and 12, the back-contact solar cell 100 in some embodiments can include a silicon wafer 10, a first doped layer 20, and a second doped layer 30.

As shown in FIGS. 11 and 12, the shady face of silicon wafer 10 can include a plurality of alternately disposed non-groove areas 11 (i.e., corresponding to the non-groove areas 122 in embodiment 1) and groove areas 12 (i.e., corresponding to the groove areas 121 in embodiment 1). Slots 121 are formed in the groove area 12, and a plurality of slots 121 that are disposed at intervals on the silicon wafer 10 form the non-groove areas 11 and groove areas 12, the corresponding areas between two adjacent slots 121 are the non-groove areas 11, and the areas to which the slots 121 correspond are the groove areas 12. The non-groove areas 11 and groove areas 12 can be arranged alternately in the transverse direction of the back-contact solar cell 100, while the slots 121 extend in the longitudinal direction.

As shown in FIG. 12, the first doped layer 20 can be disposed on the non-groove area 11, and at a predetermined position 122 of slot 121, the second doped layer 30 can include a first part 21 above the non-groove area 11 and a second part 22 extending above the slot 121 (i.e., an extending portion in corresponding embodiment 1).

The second doped layer 30 can be located at the slot 121, and at the predetermined position 122 of slot 121, the second doped layer 30 covers the bottom and side faces of slot 121 and wraps around the surface 221 of second part 22 facing the slot 121 (i.e., the bottom face of second part 22 in the figure, which corresponds to the first surface in embodiment 1) and the side faces 222 of the second part 22. The second doped layer 30 recombines with the surface 221 of the second part 22 facing the slot 121.

In such an embodiment, a slot 121 is formed at the groove area 12 of the shady face of silicon wafer 10. At the predetermined position 122 of slot 121, the first doped layer 20 includes a first part 21 in the non-groove area 11 and a second part 22 extending above the slot 121. At the predetermined position 122, the second doped layer 30 covers the bottom and side faces of slot 121 and wraps around the surface 221 facing the slot 121 and the sides 222 of the second part 22. The second doped layer 30 recombines with the surface 221 of the second part 22 facing the slot 121.

Because of the presence of the slot 121, no silicon wafer part exists on one side of the boundary region where the second doped layer 30 and the first doped layer 20 recombines. The edge recombination generated by the boundary region only affects the silicon wafer 10 on one side of the slot 121, with a narrow impact range, so that this can effectively reduce the number of affected carriers in the silicon wafer 10 by narrowing the range of silicon wafer radiated by the boundary region, and improve the electrical performance and efficiency of the back-contact solar cell 100 by increasing the filling factor. Moreover, at the predetermined position 122, the second doped layer 30 wraps around the surface 221 of the second part 22 facing the slot 121 of the first doped layer 20, and the sides 222 of the second part 22. The second doped layer 30 recombines with the surface 221 of the second part 22 facing the slot 121. The large recombination area between the second doped layer 30 and the first doped layer 20 can increase the current during electrical injection, and improve the repair efficiency and effect in the subsequent repair of the back-contact solar cell 100.

It should be noted that in some embodiments of the present application, "the predetermined position 122 of slot 121" can be understood as the entire slot 121 or some positions of the slot 121, which are subject to no restriction here. In some embodiments of the present application, the predetermined position 123 are preferably some positions of the groove area 121. In such a case, a single or a plurality of predetermined positions 123 can be set in each groove area 121, which are subject to no restriction here. In addition, in some embodiments of the present application, a single or a plurality of groove areas 121 with predetermined positions 122 can be provided, which are subject to no restriction here. As shown in FIG. 3, for example, the slots 121 with predetermined positions 123 are groove areas 121 that are on both edges of the back-contact solar cell 100 in the transverse direction. In other embodiments, of course, a single or more than two slots 121 with predetermined positions 123 may be provided, and the slots 121 can also be located in the middle or other positions of the back-contact solar cell 100, which are subject to no restriction here.

In addition, it should be noted that in the present application, "the recombination contact between the second doped layer 30 and the surface 221 of the second part 22 facing the slot 121" means the absence of insulation between them, and they can recombine through direct contact, or other thin dielectric layers. The two, for example, can be recombined through the third thin dielectric layer 60 (oxide tunneling layer) mentioned below.

In some embodiments, a plurality of predetermined positions 122 can be uniformly distributed on the shady face of the back-contact solar cell 100. As shown in FIG. 11, for example, 4 predetermined positions 122 can be distributed at four corners of the back-contact solar cell 100. Introducing contact points between the second doped layer 30 and the first doped layer 20 on the shady face can increase the current during electrical injection, and further improve the subsequent repair effect of the back-contact solar cell 100.

In a possible embodiment, in the manufacturing process, the silicon wafer 10 can be cleaned first, and a first doped layer 20 can then be prepared on the entire shady face 12 of the silicon wafer 10. Slots 121 can be formed by etching or other means, so that a non-groove area 11 and a groove area 12 are formed and, at a predetermined position 122, the second part 22 of the first doped layer 20 extends above the slot 121. In a possible embodiment, for example, some slots can be formed by laser or etching, and then the area of slots be horizontally expanded by etching to make the second part 22 extend above the slot 121.

Subsequently, a second doped layer 30 can be prepared at the slot 121 to cover the bottom and side faces of slot 121 at a predetermined position 122, and wrap around the surface 221 facing the slot 121 and the side 222, of the second part 22. The second doped layer 30 recombines with the surface 221 of the second part 22 facing the slot 121, which are subject to no restriction here.

It should be noted that as shown in FIG. 12, the side face of the second part 22 can be understood as the end face of second part 22 that extends above the slot 121, in other words, in some embodiments, the second doped layer 30 can only wrap around the end face of second part 22 that extends above the slot 121. In some embodiments, of course, the second doped layer 30 can also simultaneously wrap all the sides of second part 22 (i.e., connecting all the bottom and top surfaces of the second part 22), which are subject to no restriction here.

In this embodiment, the back-contact solar cell 100 can further include a first electrode (not shown in FIG. 11 to 15), which can be an N-type electrode, and a second electrode (not shown in FIG. 11 to 15), which can be a P-type electrode, both of which are metal electrodes. A passivation film layer can also be provided on the shady face of silicon chip 10. The first electrode, which is located in the non-groove area 11 and runs through the passivation film layer, maintains ohmic contact with the first doped layer 20 and insulation separation from the second doped layer 30, in other words, the first electrode can be located in the position where the first doped layer 20 is not wrapped or covered by the second doped layer 30, and the second electrode can be located at the slot 121 and runs through the passivation film layer to maintain ohmic contact with the second doped layer 30.

Figure 13:
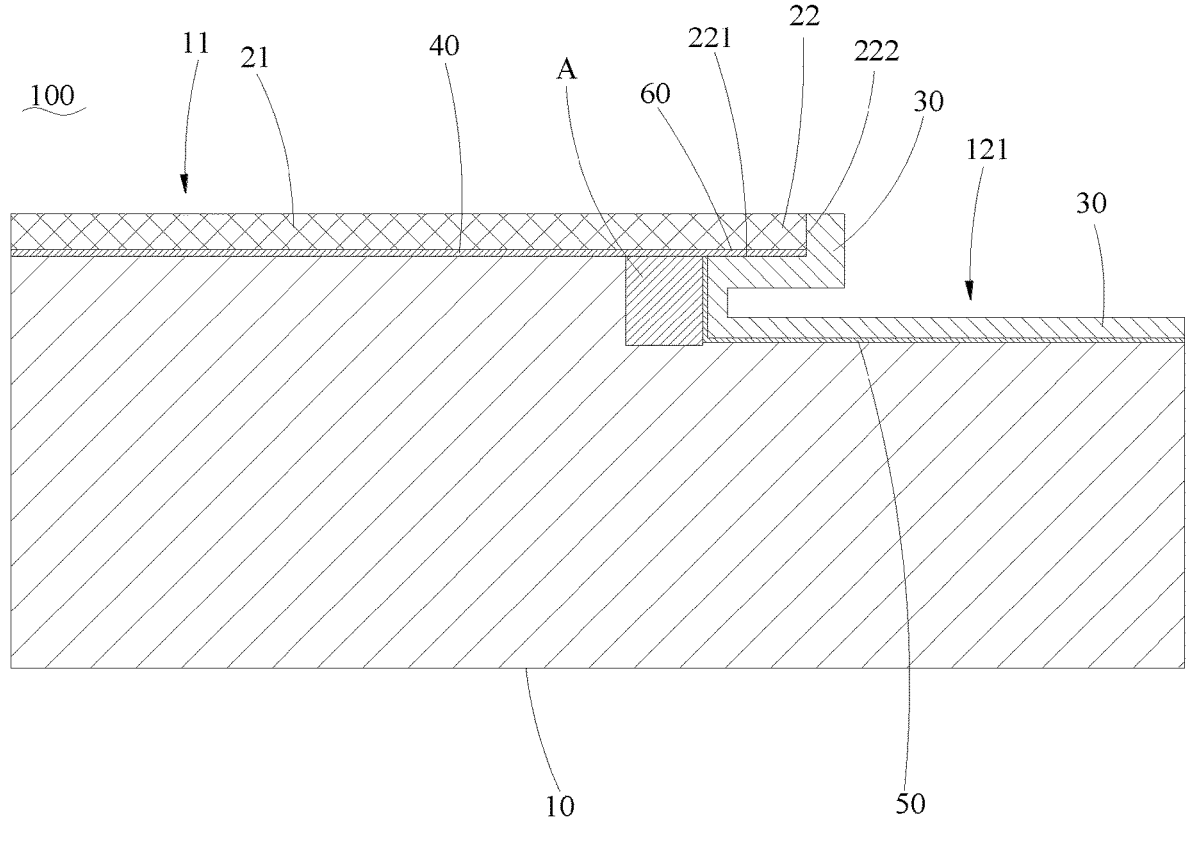
FIG. 13 is still another cross-sectional schematic diagram of XII-XII along the back-contact solar cell in FIG. 11.
Figure 14:
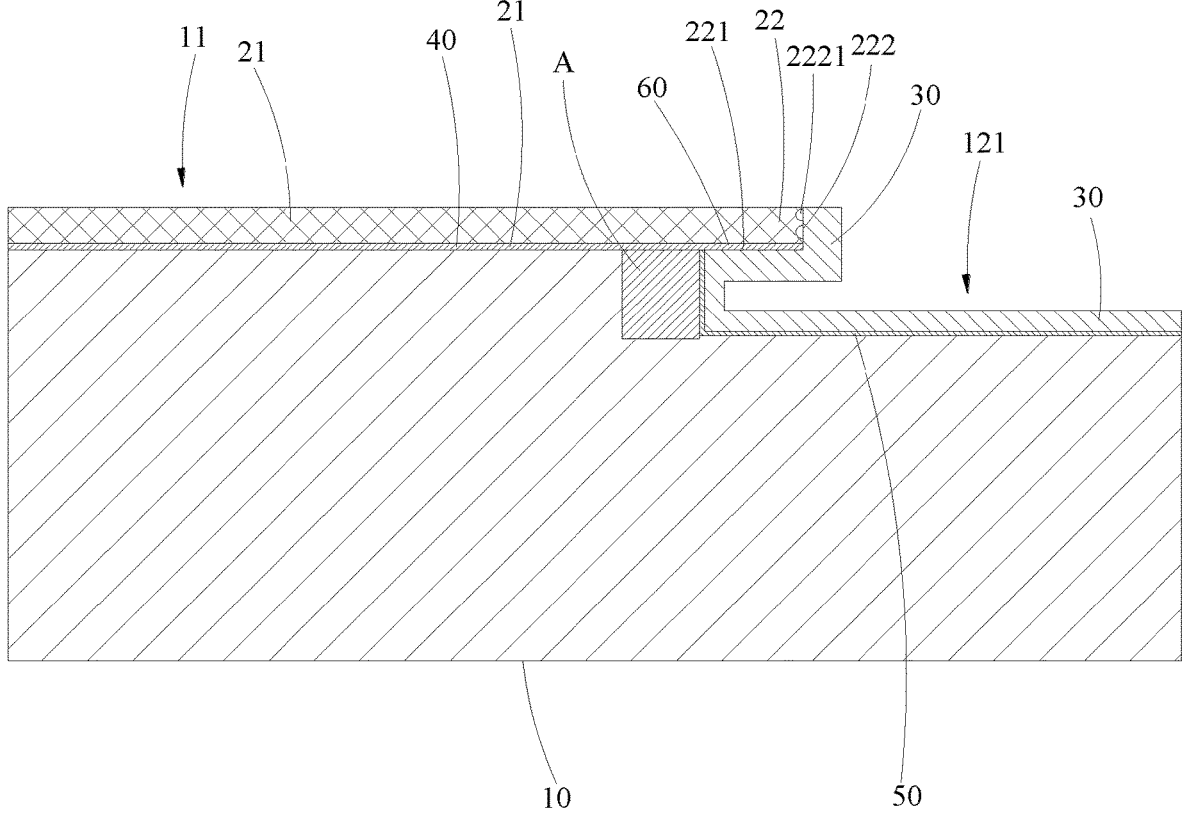
FIG. 14 is still another cross-sectional schematic diagram of the XII-XII along the back-contact solar cell in FIG. 11.

Referring to FIGS. 13 and 14, in further, in some embodiments, the back-contact solar cell 100 also includes a first thin dielectric layer 40 on the non-groove area 11. The first doped layer 20 is disposed on the first thin dielectric layer 40, that is, a first thin dielectric layer 40 is provided between the area of the first doped layer 20, except for the second part 22, and the silicon wafer 10. The first thin dielectric layer 40 can be a tunneling layer, such as a silicon oxide tunneling layer, which are subject to no specific restrictions here. The presence of the first thin dielectric layer 40 can have ideal passivation effect on the non-groove area 11, ensuring the efficiency.

In some embodiments, the portion of the second part 22 that extends above the slot 121 (i.e., the part above position 121 in FIG. 13) is 0.15 um-10 um long.

The extending portion 21 having the protrusion length within the reasonable range mentioned above can effectively ensure the contact area with the second doped layer 30 at the predetermined position 122, increase the current during electrical injection and ensure repair efficiency and effectiveness. In further, the arrangement can avoid the failure to reach the desired repair effect because of the too short second part 22 which leads to a too small recombination area, and also prevent the impact of too large contact area on the efficiency of the back-contact solar cell 100 because of the too large length.

Specifically, in such an embodiment, the length of the portion of the second part 22 that extends above the slot 121 can be understood as the length dimension of second part 22 in the arrangement direction of the non-groove area 11 and groove area 120 (i.e., the transverse direction in FIG. 11). In the present application, the length of the portion of the second part 22 that extends above the slot 121 can be 0.15 um, 0.2 um, 0.4 um, 0.6 um, 0.8 um, 1 um, 2 um, 3 um, 4 um, 5 um, 6 um, 7 um, 8 um, 9 um, 10 um, or any value between 0.15 um-10 um, which are subject to no restriction here.

In some embodiments, in the length direction of groove area 121 (i.e., the longitudinal direction in FIG. 3), the ratio of the sum of the lengths of all extending portions 21 on the shady face 12 of silicon wafer 10 to the area of shady face 12 is 0.003 cm/cm$^2$-0.6 cm/cm$^2$.

Reasonably controlling the ratio of the total length of all extending portions 21 in the length direction of groove area 121 to the area of shady face 12 of the silicon wafer 10 can avoid the failure to achieve the required repair effect because of the too small total length of extending portions 21 in the length direction of groove area 121, and also prevent the impact on the efficiency of cells of the too large proportion of extending portions 21, that is, ensuring the efficiency of back-contact solar cell 100 as well as the repair effect.

Specifically, in this application, as shown in FIG. 11, the length direction of slot 121 is the extension direction of slot 121, that is, the longitudinal direction of back-contact solar cell 100. The length of second part 22 in the length direction of slot 121 is the width of the second part 22 along the longitudinal direction of back-contact solar cell 100, that is to say, the ratio of the sum of the longitudinal widths of all second parts 22 on the entire cell to the area of shady face 12 of the silicon wafer 10 is 0.003 cm/cm$^2$-0.6 cm/cm$^2$. FIG. 11, for example, shows four second parts 22, and the ratio of the sum of the longitudinal widths of the four second parts 22 to the area of shady face is 0.003 cm/cm$^2$-0.6 cm/cm$^2$.

In some embodiments of the present application, for example, the ratio of the total length of all second parts 22 on the back-contact solar cell 100 to the area of the shady face of silicon wafer 10 can be 0.003 cm/cm$^2$, 0.01 cm/cm$^2$, 0.02 cm/cm$^2$, 20) 0.03 cm/cm$^2$, 0.04 cm/cm$^2$, 0.05 cm/cm$^2$, 0.06 cm/cm$^2$, 0.07 cm/cm$^2$, 0.08 cm/cm$^2$, 0.09 cm/cm$^2$, 0.1 cm/cm$^2$, 0.2 cm/cm$^2$, 0.3 cm/cm$^2$, 0.3 cm/cm$^2$, 0.4 cm/cm$^2$, 0.5 cm/cm$^2$, 0.6 cm/cm$^2$, or any value between 0.003 cm/cm$^2$-0.6 cm/cm$^2$, which are subject to no specific restrictions here.

In some embodiments, in a single slot 121, the number of predetermined positions 122 is M and the number of second parts 22 is also M (for example, as shown in FIG. 11, the number of predetermined positions 122 in a single slot 121 is two). In the length direction of slot 121, the ratio of the total length of M second parts 22 to the length of slot 121 is 0.005-0.5, and M is a positive integer greater than or equal to 1.

In the length direction of slot 121, setting the ratio of the total length of second parts 22 at all predetermined positions 122 to the length of slot 121 within the reasonable range can prevent the failure to achieve the required repair effect due to the too small proportion of second parts 22 in a single slot 121, and also avoid the impact on the cell efficiency of the too large proportion of second parts 22 in a single slot 121, in other words, ensuing the efficiency of back-contact solar cell 100 as well as the repair effect.

Specifically, as shown in FIG. 11, in such an embodiment, "the sum of the lengths of M second parts 22 in the length direction of slot 121" can be understood as the sum of the widths of all second parts 22 in the longitudinal direction of the back-contact solar cell 100. The length of slot 121 is the extension length of slot 121 in the longitudinal direction of the back-contact solar cell 100. In some embodiments, for example, the length of a single second parts 22 in the longitudinal direction can be 0.1 cm, the total length of slot

121 is 10 cm, and M is 5. The total length of all second parts 22 is 0.5 cm, accounting for 0.05 of the total length of slot 121.

In such an embodiment, the ratio of the total length of M second parts 22 to the length of slot 121 can be 0.005, 0.006, 0.007, 0.008, 0.009, 0.01, 0.02, 0.03, 0.04, 0.05, 0.06, 0.07, 0.08, 0.09, 0.1, 0.2, 0.3, 0.4, 0.5, or any value between 0.005-0.5, which are subject to no restriction here.

In some embodiments, in the back-contact solar cell 100, the ratio of the sum of orthographic projection areas (i.e., the orthographic projection areas along the thickness direction) of all second parts 22 on the shady face 12 of silicon wafer 10 to the area of shady face on the silicon wafer 10 is 4.5*10-8-1.5*10-5.

Setting the proportion of orthographic projection areas of all second parts 22 within this reasonable range can avoid poor repair effect because of too small area proportion of second parts 22, and can also prevent the serious impact on the efficiency of back-contact solar cell 100 of the too large area proportion of second parts 22, that is, ensuring the efficiency of back-contact solar cell 100 as well as the repair effect.

Specifically, in such an embodiment, the proportion of orthographic projection area of all second parts 22 on the shady face of silicon wafer 10 to the shady face on the silicon wafer 10 can be $4.5*10^{-8}$, $5*10^{-8}$, $6*10^{-8}$, $7*10^{-8}$, $8*10^{-8}$, $9*10^{-8}$, $1*10^{-7}$, $1*10^{-6}$, $1*10^{-5}$, $1.5*10^{-5}$, or any other value between $4.5*10^{-8}$-$1.5*10^{-5}$, which are subject to no restriction here.

Referring to FIGS. 13 and 14, in some embodiments, a second dielectric layer 50, which may be an oxide tunneling layer, can be provided between the second doped layer 30 and the bottom and side faces of slot 121. In some embodiments, for example, the second dielectric layer 50 can be a silicon oxide tunneling layer, and the presence of the second dielectric layer 50 can provide ideal passivation in the slot 121. The thickness of the second dielectric layer 50 can be determined according to the actual conditions, which are subject to no restriction here.

Referring to FIGS. 13 and 14, in some embodiments, a third thin dielectric layer 60 may be provided between the second doped layer 30 and the surface 221 of the second part 22 facing the slot 121. The second doped layer 30 recombines with the surface 221 of the second part 22 facing the slot 121 through the third thin dielectric layer 60.

In this way, the second doped layer 30 can recombine with the second part 22 through the third thin dielectric layer 60 to increase the current during electrical injection, and provide better repair efficiency and effect when repairing the back-contact solar cell 100 in the future.

Specifically, the third thin dielectric layer 60 can also be an oxide tunneling layer, for example, a silicon oxide tunneling layer, which are subject to no restriction here. The thickness of the second thin dielectric layer 50 can be determined according to the actual conditions.

Figure 15:
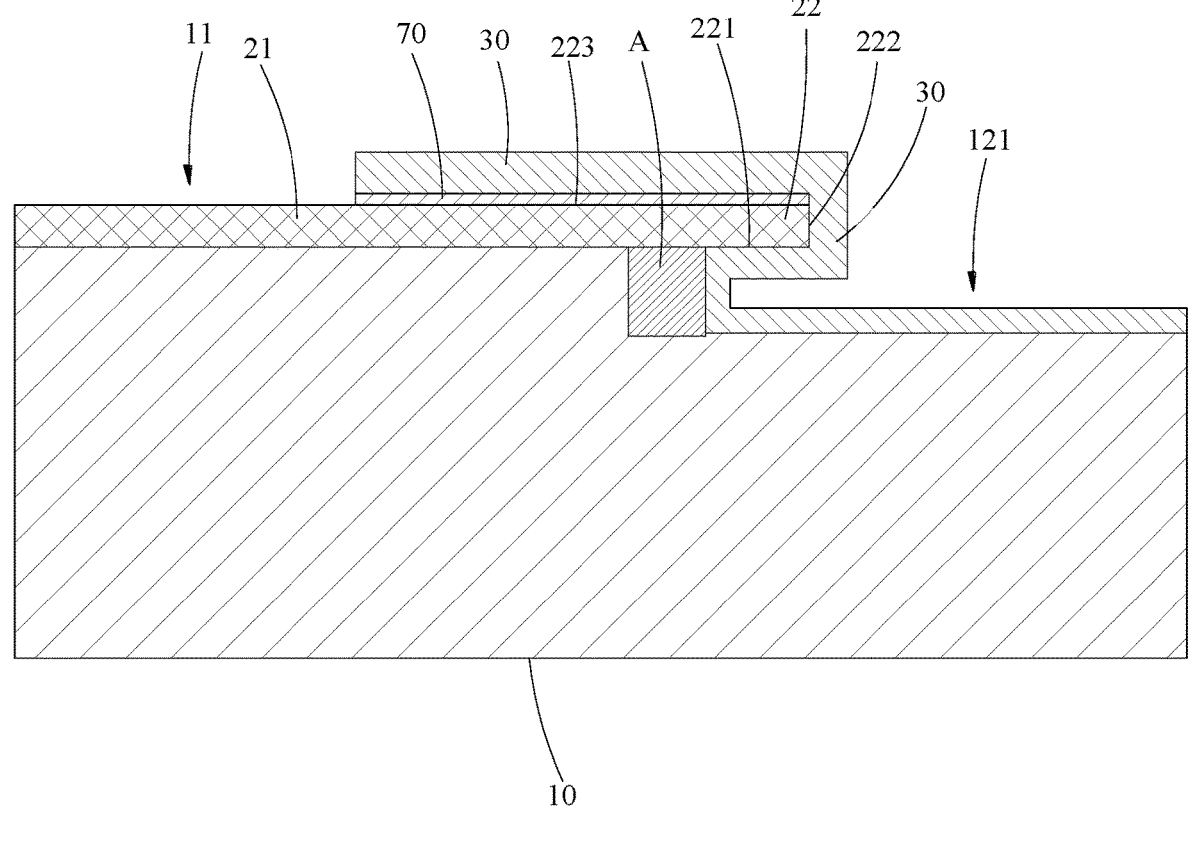
FIG. 15 is still another cross-sectional schematic diagram of the back-contact solar cell along the XII-XII section in FIG. 11.

Referring to FIG. 15, in some embodiments, the second doped layer 30 wraps around the surface 221 facing the slot 121 and the side 222 of the second part 22. The second doped layer 30 extends to the surface 223, which faces away from slot 121, of the second part 22 (i.e., the top surface of the second part 223 in FIG. 15), and an insulation layer 70 is provided between the second doped layer 30, which can extend to the surface 223 of the second part 22 away from the slot 121, and the second part 22.

The arrangement of insulation layer 70 can isolate the upper surface of the second part 22 from the second doped layer 30, avoiding extensive contact between the second doped layer 30 and the first doped layer 20.

Specifically, in such embodiments, the insulation layer 70 can also be a silicon oxide layer. Specifically, the thickness of silicon oxide film layer can be adjusted to provide it with insulation performance. When the first thin dielectric layer 40, the second thin dielectric layer 50, the third thin dielectric layer 60, and the insulation layer 70 are all silicon oxide layers, for example, the thickness of the silicon oxide layer can be reduced to enable the first thin dielectric layer 40, the second thin dielectric layer 50 and the third thin dielectric layer 60 with tunneling function, and the thickness of silicon oxide layer can be increased to provide insulation function when the insulation layer 70 is being prepared.

In such an embodiment, the first electrode can be disposed in an area of the first doped layer 20 where is not covered by the second doped layer 30, and maintains ohmic contact with the first doped layer 20 to achieve insulation isolation from the second doped layer 30, while the second electrode can be disposed in an area corresponding to the slot 121 to maintain ohmic contact with the second doped layer 30.

Referring to FIG. 14, in some embodiments, a gap 2221 is formed in at least some areas between the second doped layer 30 and the side 222 of the second part 22.

The gap 2221 between the side 222 of the second part 22 and the second doped layer 30 can reduce the contact area between the second doped layer 30 and the side 222 of second part 22, thereby reducing recombination. The presence of sufficient contact between the second doped layer 30 and the bottom surface of the second part 22, in other words, can provide an enhanced electrical injection effect, and the formation of gap 2221 between the side 222 of the second part 22 and the second doped layer 30 can effectively ensure efficiency.

Specifically, during the preparation process, a porous structure can be formed between the second doped layer 30 and the side 222 of the second part 22, so that the gap 2221 is formed in at least some areas between the second doped layer 30 and the side 222 of the second part 22.

In some embodiments, the first doped layer 20 can be 10 nm-600 nm thick, which can, while ensuring effectiveness, prevent the impact of too large contact area between the side 222 of the second part 22 and the second doped layer 30 on the efficiency due to the too thick first doped layer 20.

Specifically, the thickness of the first doped layer 20 can be 10 nm, 50 nm, 80 nm, 100 nm, 150 nm, 200 nm, 250 nm, 300 nm, 350 nm, 400 nm, 450 nm, 500 nm, 550 nm, 600 nm, or any value between 10 nm-600 um, which are subject to no restriction here.

Similarly, in such an embodiment, the second doped layer 30 can also be nm-600 nm thick, which are subject to no restriction here.

In some embodiments, the depth of the slot 121 can be 0.1 um-15 um.

The slot 121 having a depth within this reasonable range can, when the second doped layer 30 recombines with the second part 22, avoid the affected area extending to the silicon wafer 10 at the bottom of slot 121 due to the shallow slot 121, and also avoid a significant decrease in the strength of silicon wafer 10 due to the excessive depth of groove area 121. The slot 121 having a depth within this reasonable range, in other words, can minimize the impact range while ensuring the strength of silicon wafer 10, when the second doped layer 30 recombines with the second part 22.

Specifically, the inventor of the present application found that, when the depth of groove area 121 is less than 0.1 um, the impact range of the recombination between wrapping portion 31 and extending portion 21 is not only limited to one side of the groove area 121, but will also extend to the bottom of groove area 121, resulting in a larger impact range. The slot 121 with a depth greater than 0.1 um can avoid such problems and minimize the range of impact on silicon wafer 10 as much as possible, and the slot 121 with a depth greater than 15 um will cause a serious decrease in the overall strength and increase the risk of cracking of silicon wafer 10.

In such an embodiment, the depth of groove area 121 can be, for example, 0.1 um, 0.2 um, 0.3 um, 0.4 um, 0.5 um, 0.6 um, 0.7 um, 0.8 um, 0.9 um, 1 um, 2 um, 3 um, 4 um, 5 um, 6 um, 7 um, 8 um, 9 um, 10 um, 11 um, 12 um, 13 um, 14 um, 15 um, or any value between 0.1 um-15 um, which are subject to no restriction here.

In some embodiments, in the groove area 12, except for the predetermined position 12, physical isolation is provided between the first doped layer 20 and the second doped layer 30. In such a case, except for the predetermined position 122, physical isolation between the first doped layer 20 and the second doped layer 30 can avoid the impact on the efficiency of the back-contact solar cell 100 due to their excessive contact area.

Specifically, in such embodiments, except for the predetermined position 122, physical isolation is realized between the first doped layer 20 and the second doped layer 30 directly through the slot 121, or by other means, such as insulation components, which are subject to no restriction here.

In the description of the specification, the reference terms "some embodiments", "illustrative embodiments", "examples", "specific examples", or "some examples" refer to the specific features, structures, materials, or characteristics described in conjunction with the embodiments or examples included in at least one embodiment or example of the present application. The schematic expressions of the above terms in the specification do not necessarily refer to the same embodiments or examples. Moreover, the specific features, structures, materials, or characteristics described can be combined in an appropriate manner in any one or more embodiments or examples.

In addition, the above are only preferred embodiments of the present application and are not intended to limit the application. Any modifications, equivalent substitutions, and improvements made within the spirit and principles of the present application shall be included in the scope of protection of the present application.

What is claimed is:

1. A back-contact solar cell, comprising:
a silicon wafer, wherein the silicon wafer has a light-receiving face and a shady face which are mutually opposed, and the shady face is provided with a plurality of groove structures and a plurality of non-groove areas spaced at intervals, and the plurality of non-groove areas and the plurality of groove structures are disposed alternately;
a first doped layer that is disposed on the silicon wafer at a first non-groove area of the plurality of non-groove areas, wherein,
at a predetermined position in a first groove structure of the plurality of groove structures, the first doped layer includes a first portion extending above the first groove structure of the plurality of groove structures, the first doped layer is disposed on the shady face of the silicon wafer opposite to the light-receiving face of the silicon wafer, and the first portion of the first doped layer has a first surface facing towards the first groove structure of the plurality of groove structures and a second surface facing away from the first groove structure of the plurality of groove structures;
a first dielectric layer formed on the first surface, wherein a first part of the first dielectric layer has a tunneling function and is thinner than a second part of the first dielectric layer; and
a second doped layer that is disposed within the first groove structure of the plurality of groove structures and has a polarity opposite to the first doped layer, wherein,
at the predetermined position, the second doped layer has a wrapping portion disposed along a side wall surface of the first groove structure of the plurality of groove structures and covers the first and second parts of the first dielectric layer,
the first surface intersecting the side wall surface of the first groove structure of the plurality of groove structures, and
the first groove structure includes an opening at the shady face over the second doped layer, the opening is formed inside the silicon wafer and has a depth along a direction from the shady face to the light-receiving face.

2. The back-contact solar cell according to claim 1, further comprising a second dielectric layer stacked on the first non-groove area of the plurality of non-groove areas, wherein the first doped layer is stacked on the second dielectric layer.

3. The back-contact solar cell according to claim 1, wherein the wrapping portion covers the first and second parts of the first dielectric layer and an upper end of the wrapping portion is formed between the first portion and a bottom surface of the first groove structure of the plurality of groove structures.

4. The back-contact solar cell according to claim 1, wherein the first dielectric layer has a thickness of 0.5 nm-50 nm.

5. The back-contact solar cell according to claim 1, wherein the first surface has a first region and a second region, which are adjacent and continuous, along an arrangement direction of the first groove structure of the plurality of groove structures and the first non-groove area of the plurality of non-groove areas; and
the first and second parts of the first dielectric layer are formed in the first region and the second region, respectively.

6. The back-contact solar cell according to claim 1, wherein the first part of the first dielectric layer is 0.5 nm-6 nm thick, and the second part of the first dielectric layer is 2 nm-50 nm thick.

7. The back-contact solar cell according to claim 5, wherein along the arrangement direction of the first groove structure of the plurality of groove structures and the first non-groove area of the plurality of non-groove areas, a length of the first region is 0.05 um-1 um, and a length of the second region is 0.1 um-10 um.

8. The back-contact solar cell according to claim 1, wherein the first surface and the second surface intersect at the end of the first portion to form a tip, and the wrapping portion wraps around the tip.

9. The back-contact solar cell according to claim 8, wherein a hole is formed at the end of the tip.

10. The back-contact solar cell according to claim 1, wherein the first portion is 0.15 um-10 um long in an arrangement direction of the first groove structure of the plurality of groove structures and the first non-groove area of the plurality of non-groove areas.

11. The back-contact solar cell according to claim 1, wherein in a length direction of the first groove structure of the plurality of groove structures, a ratio of a total length of all first portions corresponding to the plurality of groove structures to an area of the shady face is 0.003 $cm/cm^2$-0.6 $cm/cm^2$.

12. The back-contact solar cell according to claim 1, wherein in the first groove structure of the plurality of groove structures, a quantity of predetermined positions is M, and a quantity of the first portion of the first doped layer extending above the first groove structure and the wrapping portion of the second doped layer is also M; in a length direction of the first groove structure of the plurality of groove structures, a ratio of a total length of the M first portions of the first doped layer extending above the first groove structure to a length of the first groove structure of the plurality of groove structures is 0.005-0.5, and M is a positive integer greater than or equal to 1.

13. The back-contact solar cell according to claim 1, wherein a ratio of a total orthographic projection area of all first portions corresponding to the plurality of groove structures on the shady face to an area of the shady face is $4.5*10^{-8}$-$1.5*10^{-5}$.

14. The back-contact solar cell according to claim 1, wherein at the predetermined position, a third doped layer stacked on the upper layer of the second surface has the same polarity as that of the second doped layer, the third doped layer covers the second surface, and an insulation layer is provided between the third doped layer and the second surface.

15. The back-contact solar cell according to claim 1, wherein the depth of the first groove structure of the plurality of groove structures is 0.1 um-15 um.

16. A back-contact solar cell assembly, comprising the back-contact solar cell according to claim 1.

17. A photovoltaic system, comprising the back-contact solar cell assembly according to claim 16.

\*  \*  \*  \*  \*